United States Patent [19]
Bulucea et al.

[11] Patent Number: 5,952,701
[45] Date of Patent: Sep. 14, 1999

[54] DESIGN AND FABRICATION OF SEMICONDUCTOR STRUCTURE HAVING COMPLEMENTARY CHANNEL-JUNCTION INSULATED-GATE FIELD-EFFECT TRANSISTORS WHOSE GATE ELECTRODES HAVE WORK FUNCTIONS CLOSE TO MID-GAP SEMICONDUCTOR VALUE

[75] Inventors: Constantin Bulucea, Milpitas; Daniel C. Kerr, Sunnyvale, both of Calif.

[73] Assignee: National Semiconductor Corporation, Santa Clara, Calif.

[21] Appl. No.: 08/912,053

[22] Filed: Aug. 18, 1997

[51] Int. Cl.$^6$ .......................... H01L 29/76; H01L 29/94; H01L 31/062; H01L 31/119
[52] U.S. Cl. .......................... 257/407; 257/369; 257/403; 257/412; 257/616
[58] Field of Search .................................. 257/369, 403, 257/407, 412, 616

[56] References Cited

U.S. PATENT DOCUMENTS

| | | | |
|---|---|---|---|
| 4,984,043 | 1/1991 | Vinal | 357/23.14 |
| 4,990,974 | 2/1991 | Vinal | 357/23.3 |
| 5,194,923 | 3/1993 | Vinal | 257/268 |
| 5,250,818 | 10/1993 | Saraswat et al. | 257/66 |
| 5,619,057 | 4/1997 | Komatsu | 257/382 |

OTHER PUBLICATIONS

Bohr et al, "A High Performance 0.35 $\mu$m Logic Technology for 3.3V and 2.5V Operation", *IEDM Tech. Dig.*, 1994, pp. 273–276.

Chang et al, "A High–Performance 0.25–$\mu$m CMOS Technology: I—Design and Characterization", *IEEE Trans. Electron Devices*, vol. 39, No. 4, Apr. 1992, pp. 959–966.

Chen, *CMOS Devices and Technology for VLSI* (Prentice Hall), 1990, pp. 27–33.

Davari et al, "A High–Performance 0.25–$\mu$m CMOS Technology: II—Technology," *IEEE Trans. Electron Devices*, vol. 39, No. 4, Apr. 1992, pp. 967–975.

Grove, *Physics and Technology of Semiconductor Devices* (John Wiley & Sons), 1967, pp. xiii–xix.

Hanson et al, "Analysis of the Controllability of a Sub–Micron CMOS Process Using TCAD", *Proc. International Symposium on Semiconductor Manufacturing*, paper IV–3, 1994, 5 pages.

Hillenius et al, "Gate Material Work Function Consideration For 0.5 $\mu$m CMOS", *Procs. Intl. Conf. Computer Design*, 1985, pp. 147–150.

Hu et al, "Design and Fabrication of P–channel FET for 1–$\mu$m CMOS Technology", *IEDM Tech. Dig.*, 1982, pp. 710–713.

King et al, "A Polycrystalline–$Si_{1-x}Ge_x$–Gate CMOS Technology", *IEDM Tech. Dig.*, 1990, pp. 253–256.

(List continued on next page.)

*Primary Examiner*—Ngân V. Ngô
*Attorney, Agent, or Firm*—Skjerven, Morrill, MacPherson, Franklin & Friel LLP; Ronald J. Meetin

[57] ABSTRACT

A pair of complementary CJIGFETs (100 and 160) are created from a body of semiconductor material (102 and 104). Each CJIGFET is formed with (a) a pair of laterally separated source/drain zones (112 and 114 or 172 and 174) situated along the upper surface of the semiconductor body, (b) a channel region (110 or 170) extending between the source/drain zones, and (c) a gate electrode (118 or 178) overlying, and electrically insulated from, the channel region. The gate electrode of each CJIGFET has a Fermi energy level within 0.3 ev of the middle of the energy band gap of the semiconductor material. One of the transistors typically conducts current according to a field-induced-channel mode while the other transistor conducts current according to a metallurgical-channel mode. The magnitude of the threshold voltage for each CJIGFET is normally no more than 0.5 V.

25 Claims, 13 Drawing Sheets

OTHER PUBLICATIONS

Mead et al, *Introduction to VLSI Systems* (Addison–Wesley), 1980, pp. 1–37.

Merckel, "Ion Implanted MOS Transistors—Depletion Mode Devices", *Process and Device Modeling for IC Design,* 1977, pp. 677–688.

Montree et al, "Comparison of buried and surface channel PMOS devices for low voltage 0.5 μm CMOS", *Symposium on VLSI Technology, Systems and Applications, Proceedings of Technical Papers*, 1993, pp. 11–14.

Muller et al, *Device Electronics for Integrated Circuits,* (Wiley, 2d ed.), 1986, pp. 443–457.

Nakahara et al, "Relief of Hot Carrier Constraint on Submicron CMOS Devices by Use of a Buried Channel Structure," *IEDM Tech. Dig.,* 1985, pp. 238–241.

Nishiuchi et al, "A Normally–off Type Buried Channel MOSFET for VLSI Circuits," *IEDM Tech. Dig.,* 1978, pp. 26–29.

Ng, *Complete Guide to Semiconductor Devices* (McGraw–Hill), 1995, pp. 163–178.

Nguyen et al, "A Comparison of Buried Channel and Surface Channel MOSFETs for VLSI", *IEEE Trans, Electron Devices,* vol. ED–29, No. 10, Oct. 1982, pp. 1663–1664.

Ogura et al, "Design and Characteristics of the Lightly Doped Drain—Source (LDD) Insulated Gate Field–Effect Transistor", *IEEE Trans. Electron Devices,* vol. ED–27, No. 8, Aug. 1980, pp. 1359–1367.

Parrillo et al, "A Fine–Line CMOS Technology that Uses $P^+$–Polysilicon/Silicide Gates for NMOS and PMOS Devices", *IEDM Tech. Dig,* 1984, pp. 418–422.

Rhoderick et al, *Metal–Semiconductor Contacts* (Oxford University Press), 1988, pp. 11–15, 47, and– 48.

Sze, *Physics of Semiconductor Devices* (Wiley & Sons, 2d ed.), 1981, pp. 464–469.

Yao et al, "Structure and Frequency Dependence of Hot–Carrier–Induced Degradation in CMOS VLSI," *IEEE/Int'l. Reliability Physics Symp.,* 1987, pp. 195–200.

DESIGN AND FABRICATION OF SEMICONDUCTOR STRUCTURE HAVING COMPLEMENTARY CHANNEL-JUNCTION INSULATED-GATE FIELD-EFFECT TRANSISTORS WHOSE GATE ELECTRODES HAVE WORK FUNCTIONS CLOSE TO MID-GAP SEMICONDUCTOR VALUE

FIELD OF USE

This invention relates to semiconductor technology. More particularly, this invention relates to complementary field-effect transistors of the insulated-gate type.

BACKGROUND ART

An insulated-gate field-effect transistor ("IGFET") is a semiconductor device in which a gate dielectric layer electrically insulates a channel region of a semiconductor body from an overlying gate electrode. The channel region extends between a source zone and a drain zone that adjoin a body region of the semiconductor body, the body region (often referred to as the substrate region or the substrate) being of opposite conductivity type to the source and drain. Charge carriers—i.e., electrons for an n-channel IGFET and holes for a p-channel IGFET—move from the source through the channel region to the drain when appropriate voltages are applied to the gate electrode, source, and body region. By suitably controlling these voltages, the IGFET switches between an on condition and an off condition.

IGFETs can be placed in two general categories according to their conducting characteristics: normally off, sometimes referred to as enhancement mode, and normally on, sometimes referred to as depletion mode. The terms "normally off" and "normally on" are applied to an IGFET with regard to the transistor's condition when the gate-to-source voltage is zero and the source is connected to the body region—i.e., the gate electrode, source, and body region are at the same voltage, such as ground reference. In a normally off IGFET with zero gate-to-source voltage, substantially no charge carriers flow from the source to the drain. Depending on whether the IGFET is an n-channel or p-channel device, the gate-to-source voltage must either be raised above a positive threshold voltage or dropped below a negative threshold voltage for the transistor to be turned on.

A normally on IGFET operates in substantially the opposite way to a normally off IGFET. Charge carriers flow from the source to the drain in a normally on IGFET at zero gate-to-source voltage. Depending on whether the normally on IGFET is an n-channel or p-channel device, the gate-to-source voltage must either be dropped below a negative threshold voltage or raised above a positive threshold voltage for the transistor to be turned off.

The channel region in an IGFET may be of the same conductivity type as, or of opposite conductivity type to, the source and drain.

When the channel region is of opposite conductivity type to the source and drain, the channel region is of the same conductivity type as the body region and, although typically doped to a different level than the bulk of the body region, merges junctionlessly into the bulk of the body region. An IGFET whose channel region is of opposite conductivity type to the source and drain usually is a normally off device since no conduction path from the source to the drain extends through the channel region at zero gate-to-source voltage. By applying a gate-to-source voltage suitable to place the IGFET in a conductive condition, charge carriers are attracted to the upper surface of the channel region and cause inversion to occur in a thin surface layer of the channel region. The inverted surface layer forms a conductive surface channel extending from the source to the drain. As a result, this type of IGFET is commonly referred to as a "surface-channel" device.

When the channel region is of the same conductivity type as the source and drain, the channel region is of opposite conductivity type to the body region and forms a channel/body pn junction with the body region. An IGFET having a channel region of the same conductivity type as the source and drain may be a normally on device or a normally off device dependent, among other things, on the doping level in the channel region. If the net doping level in the channel region is sufficiently high, the transistor is a normally on device. If the net channel doping, although of the same conductivity type as the source/drain doping, is sufficiently low, a depletion (or space charge) region extends across the full vertical thickness of the channel region when the gate electrode, source, and body region are at the same voltage. The transistor is then a normally off device.

In a normally off IGFET whose channel region is of the same conductivity type as the source and drain, current conduction from the source to the drain can occur along a surface layer of the channel region or through a subsurface layer of the channel region. Whether conduction occurs by way of a surface channel, or a subsurface channel, depends on various factors such as the doping level of the channel region, the doping level of the body region, and the characteristics of the gate structure.

Consider a normally off IGFET whose channel region is of the same conductivity type as the source and drain and whose gate electrode consists of polycrystalline silicon ("polysilicon") doped to be of the same conductivity type as the body region. If the net dopant concentration in the channel region in such a device is less than a predetermined value dependent on the net dopant concentration in the bulk of the body region, application of a gate-to-source voltage sufficient to make the transistor conductive typically causes a conductive surface channel to form in the otherwise charge-depleted channel region. Conversely, if the net dopant concentration in the channel region is greater than the predetermined value, application of a gate-to-source voltage sufficient to make the transistor conductive typically causes the depletion region to split into a pair of vertically separated depletion regions. The zone between the two depletion regions forms a subsurface channel, commonly termed a buried channel.

An IGFET having a channel region of the same conductivity type as the source and drain is variously referred to by persons working in the semiconductor art by anyone of the following terms: buried channel MOSFET, implanted-channel MOSFET, and junction MOSFET. Unfortunately, all of these terms are unsatisfactory. For example, characterizing such a transistor as a "buried channel MOSFET" is misdescriptive because source-to-drain conduction can occur through either a surface channel or a buried channel depending on the doping of the channel region relative to the doping of the body region. As to "implanted-channel MOSFET", the channel region is normally created by ion implantation but does not have to be ion implanted. The term "junction MOSFET" does not make it clear that the "junction" is the channel/body junction. Consequently, "junction MOSFET" is confusingly similar to the term "junction field-effect transistor" applied to a field-effect transistor having no gate dielectric layer.

Herein, an IGFET whose channel region is of the same conductivity type as the source and drain is generally referred to as a "channel-junction insulated-gate field-effect transistor," where the modifier "channel-junction" refers to the pn junction formed between the channel region and the body region. Consequently, a channel-junction insulated-gate field-effect transistor ("CJIGFET") generally means any transistor commonly referred to as a buried-channel MOSFET, an implanted-channel MOSFET, or a junction MOSFET. In particular, a normally off CJIGFET is a normally off IGFET having a channel region of the same conductivity type as the source and drain.

CJIGFETs are often used in complementary-IGFET applications in which one of the two types of opposite-polarity transistors is a CJIGFET while the other type of transistor is a surface-channel IGFET—i.e., a device whose channel region is of opposite conductivity type to the source and drain. As an example of such a "CMOS" application, see Hu et al, "Design and Fabrication of p-channel FET for 1-$\mu$m CMOS Technology," *IEDM Tech. Dig.*, 1982, pages 710–713. In Hu et al, the p-channel device is a CJIGFET while the n-channel device is a surface-channel IGFET. The opposite occurs in Parillo et al, "A Fine-Line CMOS Technology That Uses P+ Polysilicon/Silicide Gates for NMOS and PMOS Devices," *IEDM Tech. Dig.*, 1984, pages 418–422.

In general, CJIGFETs can be integrated relatively easily into CMOS process flows. Accordingly, CJIGFETs are attractive for use in products such as CMOS memories and CMOS microprocessors fabricated in large volumes. Also, CJIGFETs avoid the high gate electric field and bulk charge that cause deleterious effects in surface-channel IGFETs.

In a polysilicon-gate IGFET, the type of doping in the polysilicon of the gate electrode has a large influence on the threshold voltage. Normally, the polysilicon gate material is heavily doped to achieve a low resistivity. The Fermi energy level of heavily doped n-type polysilicon is close to the energy at the edge of the conduction band of silicon, while the Fermi energy level of heavily doped p-type polysilicon is close to the energy at the edge of the valance band of silicon.

The work function of a material is the difference between the vacuum energy level and the Fermi energy level of the material. Inasmuch as the silicon conduction band energy is approximately 1.1 eV greater than the silicon valance band energy, the work function of heavily doped p-type polysilicon is typically about 1.1 eV greater than the work function of heavily doped n-type polysilicon. This translates into an approximate 1.1-V effect on the threshold voltage. That is, changing the gate material from heavily doped p-type polysilicon to heavily doped n-type polysilicon causes the threshold voltage of a polysilicon-gate IGFET to be reduced by approximately 1.1 V, and vice versa.

Field-effect transistors used in integrated circuits are progressively being made smaller and smaller. As device miniaturization continues, the circuit supply voltages become progressively smaller. Accordingly, it is necessary for the magnitude of the threshold voltage to be decreased correspondingly. Also, in a complementary-IGFET application, it is desirable that the p-channel threshold voltage be of approximately the same magnitude as the n-channel threshold voltage.

Hillenius et al, "Gate Material Work Function Considerations For 0.5 $\mu$m CMOS," *Procs. Intl. Conf. Computer Design*, 1985, pages 147–150, addresses the preceding issues. Hillenius et al discusses various CMOS architectures in which the threshold voltages of both the n-channel and p-channel devices have approximately equal magnitudes in the vicinity of 0.5 V. Among these architectures are arrangements in which one of the types of complementary IGFETs is a CJIGFET while the other is a surface-channel IGFET. Although concluding that a doped polysilicon gate electrode is the best for complementary IGFETs of 0.5-$\mu$m gate length, Hillenius et al suggests that p-channel and n-channel threshold voltages of approximately equal magnitude could be achieved by using tungsten for the gate electrodes of both types of IGFETs. The reason for this is that the work function of tungsten places the Fermi energy level near the "midgap" of silicon—i.e., approximately half way between the energy levels at the conduction and valence bands of silicon.

King et al, "A Polycrystalline-$Si_{1-x}Ge_x$ Gate CMOS Technology," *IEDM Tech. Dig.*, 1990, pages 253–256, discusses various CMOS architectures directed towards a 0.7-V magnitude for the threshold voltages of both the n-channel and p-channel devices. At least one of the two types of complementary IGFETs in each of the CMOS cases considered in King et al is a surface-channel IGFET. King proposes that heavily doped p-type polycrystalline silicon-germanium material be used for the gate electrode of both the n-channel and p-channel transistors. When the heavily doped p-type polycrystalline silicon-germanium material is 60% germanium, King reports that the work function is reduced by 0.3 V compared to that of p-type silicon. This brings the Fermi energy level of the silicon-germanium material close to the midgap of silicon.

Hillenius et al and King et al offer significant advantages. However, each of their complementary-IGFET architectures includes at least one surface-channel IGFET. Consequently, all of the complementary transistor architectures in Hillenius et al and King et al are subject to the high gate electric field and bulk charge problems that generally arise with surface-channel IGFETs.

Vinal, U.S. Pat. No. 4,990,974, describes a CJIGFET whose threshold voltage is twice the "Fermi" potential. This IGFET, referred to by Vinal as a Fermi-FET, is a silicon device having a silicon oxide gate dielectric and a doped polysilicon gate electrode of opposite conductivity type to the source and drain. Advantageously, Vinal reports that the value of the threshold voltage is independent of the gate oxide thickness, channel length, drain voltage, and substrate doping. To attain these benefits, the net average channel dopant concentration is set equal to the bulk substrate dopant concentration. Also, the net dopant concentration in the polysilicon gate electrode must equal the bulk substrate dopant concentration.

The capability reported by Vinal to make the threshold voltage insensitive to gate oxide thickness, channel length, and drain voltage is highly advantageous. However, the parameter design space in which Vinal can achieve these advantages is very small. This presents severe fabrication difficulties. In addition, the magnitude of the two-Fermi threshold voltage is typically in the vicinity of 0.7 V for a silicon CJIGFET. While this is moderately low, many future applications will require a threshold voltage magnitude of 0.5 V or less, a level unattainable with Vinal's Fermi-FET.

Vinal discloses that his Fermi-FET design can be used in complementary-FET applications. In that event, the n-channel Fermi-FET has a p-doped polysilicon gate electrode while the p-channel Fermi-FET has an n-doped polysilicon gate electrode. The necessity to dope the gate electrodes with dopants of opposite conductivity type increases the transistor fabrication difficulty, especially as gate electrodes are made shorter and enter the sub-$\mu$m range of minimum feature size.

For low supply voltage applications, it would be desirable to have a complementary-IGFET architecture in which the threshold voltages of both the n-channel and p-channel transistors can readily be set at approximately equal magnitudes of 0.5 V or less and do not vary significantly with parameters such as the gate dielectric thickness and details of the channel doping profile. This is particularly important in IC fabrication process developed for analog and mixed signal applications where the transistor modeling from die to die and wafer to wafer is critical. It would also be desirable to have a substantial design space so as to enable practical device fabrication. Furthermore, it would be desirable to form the gate electrodes from substantially the same physical material so as to simply transistor fabrication.

GENERAL DISCLOSURE OF THE INVENTION

The present invention furnishes such a complementary-IGFET architecture. A key feature of the present complementary-transistor architecture is that both the n-channel and p-channel devices are channel-junction insulated-gate field-effect transistors. The high gate field and deleterious bulk charge effects of conventional complementary-IGFET architectures in which at least one of the types of complementary devices is a surface-channel IGFET are avoided, thereby improving device performance.

The work functions of the gate electrodes of both the n-channel and p-channel CJIGFETs in the complementary-transistor architecture of the invention are chosen so as to set the Fermi energy levels of the gate electrodes close to the mid-gap of the semiconductor material in which source/drain zones are provided for the CJIGFETs. This enables the threshold voltages of the n-channel and p-channel devices to be set at magnitudes close to each other. With the gate electrode Fermi energy levels close to the mid-gap point, the threshold voltages of the complementary CJIGFETs can readily be set at magnitudes of 0.5 V or less. Also, the threshold voltages are largely independent of gate dielectric thickness and details of the channel doping profile, thereby enabling improved parameter matching to be achieved. The invention thus provides a large advance over the prior art.

The starting point for the complementary-transistor structure of the invention is a body of semiconductor material having an upper surface. The semiconductor material has an electron affinity $\chi_S$ and a valence-to-conduction band-gap energy $E_G$. Source/drain zones for complementary first and second field-effect transistors are provided in the semiconductor body. In particular, each transistor has a pair of laterally separated source/drain zones situated in the semiconductor body along its upper surface. Preferably, both transistors are normally off devices.

A channel region extends between the source/drain zones of each transistor. The source/drain zones and channel region of the first transistor are of a first conductivity type. The source/drain zones and channel region of the second transistor are of a second conductivity type opposite to the first conductivity type. Since the channel region of each transistor is of the same conductivity type as that transistor's source/drain zones, each transistor is a CJIGFET. The channel region of each CJIGFET forms a pn junction with an adjoining body region in the semiconductor body.

Each CJIGFET has a gate electrode that overlies, and is electrically insulated from, the channel region of that CJIGFET. The gate electrode of each CJIGFET is chosen to have a Fermi energy level within 0.3 eV of the middle of the energy band gap $E_G$ of the semiconductor material. This is equivalent to saying that the gate electrode of each CJIGFET has a work function within 0.3 eV of the value $\Phi_{MX}$ determined from:

$$\Phi_{MX} = \chi_S + \frac{E_G}{2} \quad (1)$$

Since $\chi_S$ is the electron affinity and $E_G$ is the energy difference between the conduction and valence bands of the semiconductor material containing the source/drain zones, $\Phi_{MX}$ is the work function value at the mid-gap of the semiconductor material.

The gate electrodes of both CJIGFETs normally consist of largely the same type of electrically conductive material. When the semiconductor material is silicon, the work functions of the gate electrodes can be set at a value within 0.3 eV of $\Phi_{MX}$ for silicon by using molybdenum, tungsten, cobalt, or/and conductively doped polycrystalline silicon-germanium for both gate electrodes.

For a gate-electrode work function precisely equal to mid-gap value $\Phi_{MX}$ as given in Eq. 1 accompanied by properly chosen channel dopings, both the p-channel and n-channel CJIGFETs are normally off devices. The magnitude (absolute value) $V_{TX}$ of the threshold voltage of each CJIGFET is then given approximately as:

$$V_{TX} = \left(\frac{kT}{q}\right)\ln\left(\frac{\overline{N}_{CX}}{n_i}\right) \quad (2)$$

where k is the electronic charge, T is the absolute temperature, q is Boltzmann's constant, $\overline{N}_{CX}$ is the average net dopant concentration in that CJIGFET's channel region at the surface-channel-to-buried-channel crossover location, and $n_i$ is the intrinsic carrier concentration of the semiconductor material. Upon taking sign into account, the threshold voltage for the n-channel CJIGFET in such a pair of ideal CJIGFETs equals $+V_{TX}$ and thus is positive, whereas the threshold voltage for the p-channel CJIGFET equals $-V_{TX}$ and thus is negative. At the surface-channel-to-buried-channel crossover location where the magnitudes of the threshold voltages for the two CJIGFETs can be set equal to each other, the conduction mechanism in the channel region of each transistor switches between a surface channel and a buried channel.

By allowing the work function(s) of the gate electrodes to differ from mid-gap value $\Phi_{MX}$ by up to 0.3 eV, the magnitude (again, absolute value) of the threshold voltage of each CJIGFET can differ from $V_{TX}$ by up to 0.3 V. In particular, when the magnitude of the threshold voltage of the n-channel CJIGFET is up to 0.3 V greater than $V_{TX}$, the magnitude of the threshold voltage of the p-channel CJIGFET can be up to 0.3 V less than $V_{TX}$, and vice versa. In terms of sign, the n-channel threshold voltage can thus be up to 0.3 V higher (further from zero) than $V_{TX}$ when the p-channel threshold voltage is up to 0.3 V higher (closer to zero) than $-V_{TX}$. Likewise, the n-channel threshold voltage can be up to 0.3 V lower (closer to zero) than $V_{TX}$ when the p-channel threshold voltage is up to 0.3 V lower (further from zero) than $-V_{TX}$.

The imbalance in threshold voltage can be partially cancelled (or compensated for) by arranging for the average net dopant concentrations in the CJIGFET channel regions to deviate from their respective $\overline{N}_{CX}$ values in a complementary manner. Depending on whether the average net dopant concentration in the channel region of each CJIGFET is greater than or less than $\overline{N}_{CX}$, either a buried channel or a surface channel is produced in that CJIGFET's channel region to enable charge carriers to move between the source/drain zones. Since, the average net dopant concentrations of the channel regions differ from their ideal $\overline{N}_{CX}$ values in a complementary manner, the CJIGFET with the increased average net channel dopant concentration operates in a field-induced-channel mode with a surface channel. The CJIGFET with the decreased average net channel dopant concentration operates in a metallurgical channel mode with a buried channel.

In accordance with the invention, fabrication of the present complementary-transistor structure begins with a semiconductor body having a p-type body region and an n-type body region, each extending to the upper semiconductor surface. First n-type and p-type dopants are respectively introduced into the p-type and n-type body regions to define n-type and p-type channel regions for the complementary transistors. The channel dopants are introduced into the body regions under such doping conditions that each CJIGFET attains a threshold voltage whose magnitude is within 0.3 V of value $V_{TX}$ when the CJIFETs are provided with gate electrodes according to the invention's teachings.

First and second gate dielectric layers are respectively provided over the n-type and p-type channel regions. First and second gate electrodes having work functions within 0.3 eV of $\chi_S + E_G/2$ are respectively provided above the first and second gate dielectric layers. The gate electrodes are normally formed from largely the same type of electrically conductive materially conductive material, again typically molybdenum, tungsten, cobalt, or/and conductively doped polycrystalline silicon-germanium.

Second n-type and p-type dopants are respectively introduced selectively into the p-type and n-type body regions to form a pair of n-type source/drain zones and a pair of p-type source/drain zones. The n-type channel region extends between the n-type source/drain zones while the p-type channel region extends between the p-type source/drain zones. An n-channel CJIGFET is thereby constituted with the n-type source/drain zones, the n-type channel region, the first gate dielectric layer, and the first gate electrode. Likewise, a p-channel CJIGFET is constituted with the p-type source/drain zones, the p-type channel region, the second gate dielectric layer, and the second gate electrode.

By using the same type of physical material for the gate electrodes of both the n-channel and p-channel CJIGFETs, fabrication of the present complementary IGFET structure is simpler than that of prior polysilicon-gate complementary-IGFET structures, such as that of Vinal, where the gate electrode of the n-channel IGFET is doped oppositely to the gate electrode of the p-channel IGFET. The present invention thereby avoids the increased fabrication complexities and greater process control difficulties that arise when the gate electrodes of complementary IGFETs are oppositely doped. As a consequence, the present invention is especially suitable for future applications that require short gate electrodes, particular gate electrodes of sub-$\mu$m length. In short, the invention provide a large advance over the prior art.

BRIEF DESCRIPTION OF THE DRAWINGS

FIG. 1a illustrates the-off-condition, while FIG. 1b illustrates the on condition.

FIG. 5a illustrates the off-condition, while FIG. 5b illustrates the on-condition.

FIG. 11a covers a substantial number of different values for the channel dopant concentration, while FIG. 11b illustrates the effects of change in the gate oxide thickness.

FIG. 13 presents the work functions and built-in potential.

FIG. 15a illustrates an example in which heavily doped material of the drain extends below the gate electrode, while FIG. 15b illustrates an example in which the drain has a more lightly doped portion that extends below the gate electrode.

Like reference symbols are employed in the drawings and in the description of the preferred embodiments to represent the same, or very similar, item or items.

DESCRIPTION OF THE PREFERRED EMBODIMENTS

Figure 1A:
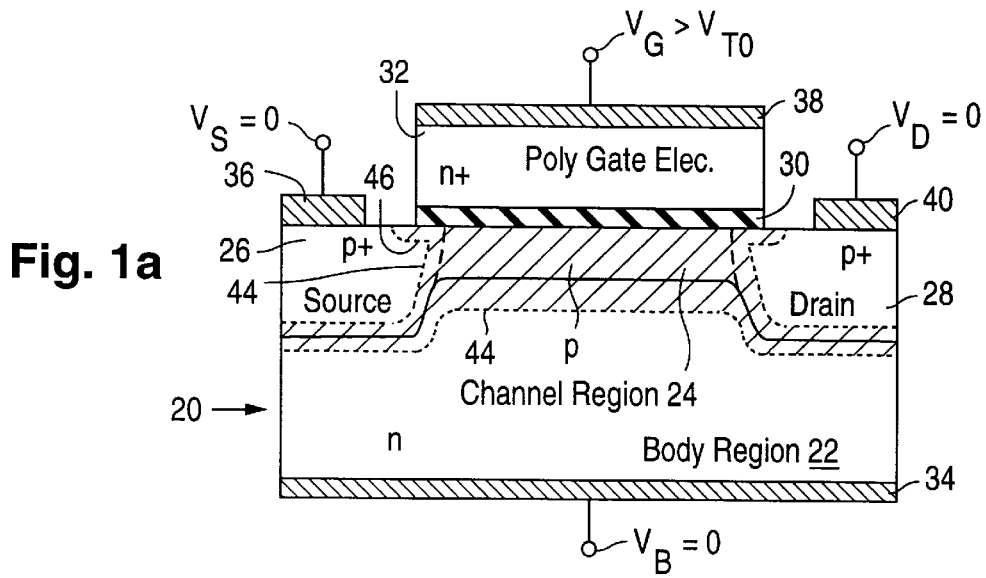
FIGS. 1a and 1b are cross-sectional views of a polysilicon-gate p-channel CJIGFET that conducts according to a buried-channel mechanism.

1. Building Blocks of Semiconductor Architecture Formed with Complementary CJIGFETs Whose Gate Electrodes Have Fermi Energy Levels Close to Mid-gap of Semiconductor Material 1.1 Reference Notation and Other Preliminary Matters The reference symbols used below and in the drawings generally follow the notation of Grove, *Physics and Technology of Semiconductor Devices* (John Wiley & Sons), 1967. The subscripts "B" and "C", generally in parentheses when combined with one or more other subscripts, respectively denote quantities in the body and channel regions of a CJIGFET. The superscripts "m" and "f" respectively refer to metallurgical-channel operation and field-induced-channel operation for a CJIGFET. Electric potentials are generally indicated by reference symbols beginning with "ψ" rather than with "Φ" in order to avoid confusion with work functions and Fermi potentials, both of which are represented by reference symbols beginning with "101".

With this in mind, the reference symbols used below and in the drawings have the following meanings:

$A_1$=fitting constant
$A_2$=fitting constant
$C_{OX}$=gate dielectric capacitance per unit area
E=electric field
$E_0$=vacuum reference energy
$E_C$=energy at edge of conduction band
$E_F$=Fermi energy level
$E_G$=band-gap energy between conduction band and valance band
$E_i$=energy at intrinsic Fermi level
$E_V$=energy at edge of valence band
erf=error function
k=Boltzmann's constant
$L_C$=Gaussian characteristic length of channel acceptor profile
$L_{D(C)}$=extrinsic Debye length at uniform net dopant concentration of channel region
$\bar{L}_{D(C)}$=extrinsic Debye length at average net dopant concentration of channel region
N=a local net dopant concentration
$N_0$=total concentration, at upper surface of channel region, of dopant of opposite conductivity type to body dopant
$N_B$=uniform net dopant concentration in body region
$\bar{N}_B$=average net dopant concentration in body region
$N_{B0}$=background dopant concentration in body region
$\bar{N}_B^f$=effective average body dopant concentration for field-induced-channel operation
$\bar{N}_B^M$=effective average body dopant concentration for metallurgical-channel operation
$N_C$=uniform net dopant concentration in channel region
$\bar{N}_C$=average net dopant concentration in channel region
$N_{C0}$=net dopant concentration at upper surface of channel region
$\bar{N}_{C(n)}$=average net dopant concentration in channel region of n-channel CJIGFET
$\bar{N}_{C(P)}$=average net dopant concentration in channel region of p-channel CJIGFET
$\bar{N}_{CX}$=average net dopant concentration in channel region at crossover boundary between metallurgical-channel operation and field-induced-channel operation
$N_{POLY}$=net dopant concentration of doped polysilicon gate electrode
$n_i$=intrinsic carrier concentration of semiconductor material
$Q_f$=interface charge per unit area at gate dielectric/channel region interface
$Q_{FB(B)}$=body-side charge of depletion region along channel/body junction at flat-band condition
$Q_{FB(C)}$=channel-side charge of depletion region along channel/body junction at flat-band condition
$Q_{INV(B)}$=body-side charge of depletion region along channel/body junction at inversion
q=electronic charge
T=absolute temperature
$t_{OX}$=gate dielectric thickness
$V_B$=body voltage
$V_D$=drain voltage
$V_{FB}$=flat-band voltage
$V_{FB(B\&C)}$=flat-band voltage of channel region in surface-channel IGFET
$V_{FB(C)}$=flat-band voltage of thick channel region in CJIGFET for which $y_j$ is at least $y_{JMIN}$
$V_G$=gate voltage
$V_{GS}$=gate-to-source voltage
$V_{T0}$=long-channel threshold voltage
$V_{T0}$ ($10^{20}$) =long-channel threshold voltage at polysilicon gate dopant concentration of $10^{20}$ atoms/cm$^3$
$V_{T0}$ ($N_{POLY}$)=long-channel threshold voltage at arbitrary polysilicon gate dopant concentration
$V_{T0}^f$=long-channel threshold voltage for field-induced-channel operation in CJIGFET
$V_{T0}^m$=long-channel threshold voltage for metallurgical-channel operation in CJIGFET
$V_{T0(n)}$=long-channel threshold voltage of n-channel CJIGFET
$V_{T0(p)}$=long-channel threshold voltage of p-channel CJIGFET
$V_{T0}^{sim}$=simulated long-channel threshold voltage
$V_{TX}$=long-channel threshold voltage at crossover boundary between metallurgical-channel operation and field-induced-channel operation
$W_{FB(B)}$=body-side thickness of depletion region along channel/body junction at flat-band condition
$W_{INV(B)}$=body-side thickness of depletion region along channel/body junction at inversion
y=depth into semiconductor body measured from upper semiconductor surface
$y_0$=thickness (or depth) of field-induced surface depletion region
$y_{0INV}$=thickness of field-induced surface depletion region at inversion
$y_J$=junction depth of channel region in CJIGFET
$y_{JMAX}$ =maximum junction depth for normally-off metallurgical-channel operation
$y_{JMIN}$=minimum junction depth for metallurgical-channel operation
X=fraction of germanium in polycrystalline silicon-germanium alloy
$\Delta\psi_0$=built-in voltage at channel/body junction of thick channel region in CJIGFET where $y_J$ exceeds $y_{JMIN}$
$\Delta\psi_{FB}$=built-in voltage between gate dielectric and channel region at flat-band condition
$\Delta\psi_{INV}$=voltage drop between gate dielectric and channel region at inversion
$\Delta\psi_{OXINV}$=voltage drop in gate dielectric at inversion $\Delta\psi_R$=general reverse bias voltage drop between upper semiconductor surface and body region at surface-terminated pn junction $\delta$=threshold voltage fitting discontinuity $\in_{OX}$=permittivity of gate dielectric $\in_S$=permittivity of semiconductor material $\Phi_{F(0)}$=Fermi potential at upper surface of channel region in CJIGFET at flat-band condition $\Phi_{F(B)}$=Fermi potential in electrically neutral portion of bulk of body region $\Phi_{F(B\&C)}$=Fermi potential at upper surface of channel region in surface-channel IGFET $\Phi_{F(C)}$=Fermi potential at net dopant concentration of thick channel region in a CJIGFET for which $y_J$ exceeds $y_{JMIN}$ $\Phi_{F(POLY)}$=Fermi potential at net dopant concentration of polysilicon gate electrode $\Phi_{M(G)}$=work function (in volts) of general gate electrode $\Phi_{M(POLY)}$=work function (in volts) of doped polysilicon gate electrode $\Phi_{M(POLY)}(10^{20})$ polysilicon work function (in volts) of dopant concentration of $10^{20}$ atoms/cm$^3$ $\Phi_{MX}$=mid-gap work function value (in volts) of gate electrode $\Phi_{S(0)}$=work function (in volts) of semiconductor material at upper surface of channel region in CJIGFET at flat-band condition $\Phi_{S(B)}$=work function (in volts) of semiconductor material in electrically neutral portion of bulk of body region $\Phi_{S(B\&C)}$=work function (in volts) of semiconductor material at upper surface of channel region in surface-channel IGFET $\Phi_{S(C)}$=work function (in volts) of semiconductor material in channel region of CJIGFET $\rho$=electric charge $\chi_s$=electron affinity of semiconductor material $\psi$=electric potential An understanding of the present complementary-transistor architecture can be facilitated by examining the building blocks of the architecture. For this purpose, it is advantageous to first examine a normally off polysilicon-gate CJIGFET. As indicated above, conduction can occur in a normally off polysilicon-gate CJIGFET through either a surface channel or a buried channel. Accordingly, the structure and operation of both of these types of normally off polysilicon-gate CJIGFETs are analyzed below. The analysis is then extended to the particular types of CJIGFETs used in the complementary-transistor architecture of the invention.

The following analysis is performed with p-channel CJIGFETs. The principles of the analysis apply directly and fully to corresponding n-channel CJIGFETs, subject to appropriate polarity inversions. For example, raising the gate-to-source voltage of a normally off n-channel CJIGFET above a positive threshold voltage is equivalent to dropping the gate-to-source voltage of a normally off p-channel CJIGFET below a negative threshold voltage.

1.2 Polysilicon-gate CJIGFET That Conducts Through a Buried Channel

Figure 1B:
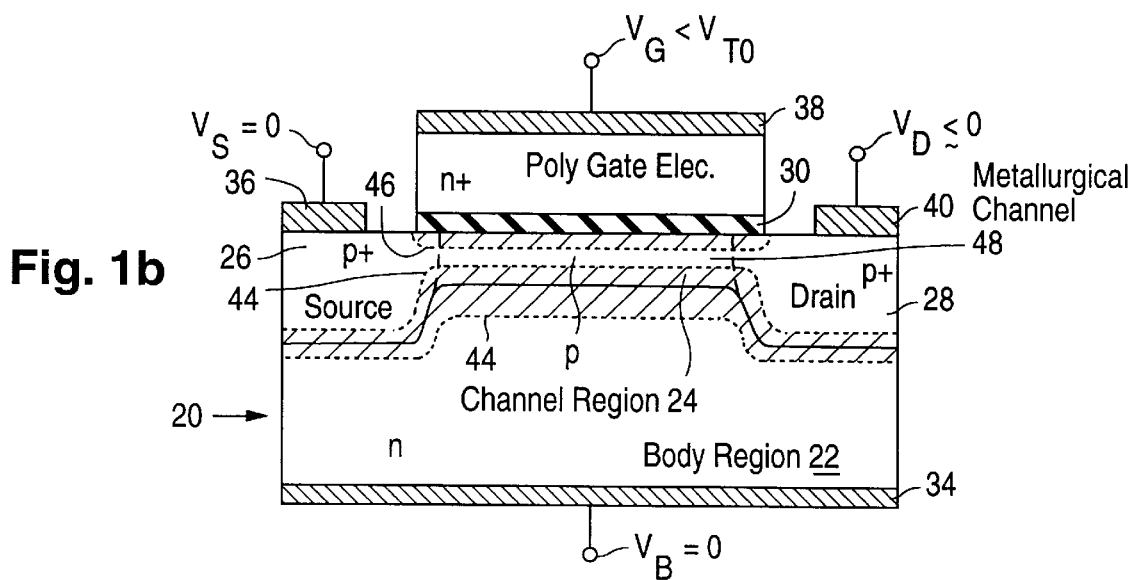

FIGS. 1*a* and 1*b* illustrate a normally off polysilicon-gate p-channel CJIGFET 20 that conducts according to a buried-channel mechanism. FIG. 1*a* presents typical voltage/channel-depletion conditions for p-channel CJIGFET 20 when it is turned off. FIG. 1*b* presents typical voltage/channel conduction conditions for CJIGFET 20 when it is turned on and operating in its linear range at a small magnitude of the drain-to-source voltage.

Figure 2:
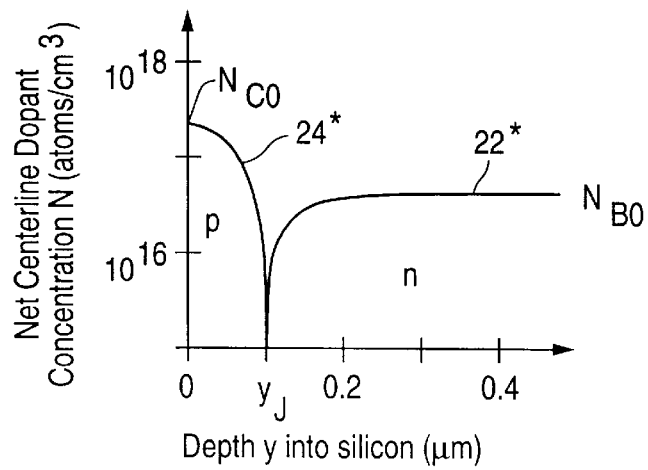
FIG. 2 is a graph of the net vertical dopant concentration through the center of the CJIGFET of FIGS. 1a and 1b.

The vertical doping profile along the center of CJIGFET 20 in FIGS. 1*a* and 1*b* (collectively "FIG. 1") is assumed to be of the type shown in FIG. 2. The doping profile of FIG. 2 is suitable for a device having a minimum-drawn gate length of 0.25–1 $\mu$m and a gate oxide thickness of 5–20 nm. The doping profile of FIG. 2 is a Gaussian profile that would specifically result from performing a p-type diffusion from the upper semiconductor surface into a uniformly doped n-type background, and thus is also approximately the Gaussian profile that would result from ion implanting a p-type dopant shallowly into a uniformly doped n-type background followed by a heating step to activate the implanted dopant and drive it further into the semiconductor material.

CJIGFET 20 is created from a monocrystalline silicon ("monosilicon") semiconductor body having an n-type body region 22. A p-type channel region 24 forms a pn junction with n body region 22. P channel region 24 extends between a source zone 26 and a drain zone 28 along the upper semiconductor surface. Each of zones 26 and 28 is heavily doped p-type and thus is of the same conductivity type as p channel region 24. A thin thermally grown silicon oxide gate dielectric layer 30 vertically separates p channel region 24 from an overlying heavily doped n-type polysilicon gate electrode 32.

Body voltage $V_B$, source voltage $V_S$, and gate voltage $V_G$ are respectively applied to body region 22, p+ source 26, and n+ polysilicon gate electrode 32 through metal contacts 34, 36, and 38. Drain voltage $V_D$ is taken from p+ drain 28 by way of a metal contact 40. CJIGFET 20 is a long-channel device. Since CJIGFET 20 is a p-channel device, long-channel threshold voltage $V_{T0}$ is negative. For the dopant profile of FIG. 2 at a typical gate oxide thickness of 10 nm, threshold voltage $V_{T0}$ for CJIGFET 20 is approximately −0.6 V. CJIGFET 20 is turned on when gate-to-source voltage $V_{GS}$ is less than or equal to $V_{T0}$—i.e. $|V_{GS}|$ is greater than or equal to $|V_{T0}|$—and is turned off when voltage $V_{GS}$ is greater than $V_{T0}$—i.e., $|V_{GS}|$ is less than $|V_{T0}|$.

FIG. 2 presents local net dopant concentration N along the vertical center (or centerline) of CJIGFET 20 in FIG. 1 as a function of depth y into the semiconductor body. The upper surface of the semiconductor body corresponds to depth y equal to zero. The pn junction between n body region 22 and p channel region 24 occurs at depth $y_J$. Curve segment 22* in FIG. 2 indicates the local net n-type (donor) dopant concentration of body region 22. Dopant concentration N reaches a net background n-type body dopant concentration $N_{B0}$ in the bulk of body region 22. Curve segment 24* indicates the net local p-type (acceptor) dopant concentration of channel region 24. Dopant concentration N reaches a maximum net p-type dopant concentration $N_{C0}$ at the upper surface of channel region 24. In the dopant profile of FIG. 2, net p-type channel surface dopant concentration $N_{C0}$ is much greater than net n-type background body dopant concentration $N_{B0}$. Consequently, p channel region 24 is typically doped to a greater net doping level than n body region 22.

Channel region 24 is normally formed by ion implanting a p-type dopant, typically boron, shallowly through the upper semiconductor surface into the semiconductor body and then performing an anneal to activate the implanted dopant and drive it to a desired depth into the semiconductor body. For the purposes of analysis, net center dopant concentration N is assumed to be approximately given by the Gaussian relationship:

$$N(y)=|N_0 e^{-(y/L_C)}-N_{B0}| \qquad (3)$$

By removing the absolute value signs from Eq. 3, dopant concentration N(y) can be taken as the net p-type (acceptor)

dopant concentration. In this case, a negative value for N(y) indicates a net n-type (donor) dopant concentration. $N_0$, the total p-type dopant concentration at the upper surface of channel region 24, is related to n-type background body concentration $N_{BO}$ and p-type channel surface concentration $N_{CO}$, according to:

$$N_0 = N_{CO} + N_{BO} \tag{4}$$

Local dopant concentration N(y) in Eq. 1 goes to zero when depth y equals channel junction depth $y_J$. Consequently, $L_C$, the Gaussian characteristic length of the channel profile, is given as:

$$L_c = \frac{y_J}{\sqrt{\ln(N_0/N_{BO})}} \tag{5}$$

With CJIGFET 20 at the non-conductive voltage conditions indicated in FIG. 1a, a depletion (or space charge) region extends across the entire vertical thickness of channel region 24. Substantially all mobile charge carriers (holes) are depleted from channel region 24. As a result, substantially no charge carriers can flow through channel region 24.

When center doping profile is of the type shown in FIG. 2 with polysilicon gate electrode 32 being doped n-type, the depletion region that engulfs channel region 24 has two distinct components: (a) a lower component 44 extending along the channel/body junction and (b) an upper component 46 extending along the upper surface of channel region 24 below gate oxide layer 30. Upper depletion component 46 arises due to the electric field exerted by n+ polysilicon gate electrode 32 exerted through gate dielectric layer 30.

When p-channel CJIGFET 20 is placed at the conductive voltage conditions indicated in FIG. 1b, the less positive value of gate-to-source voltage $V_{GS}$ causes upper depletion component 46 to withdraw from lower depletion component 44. A metallurgical channel 48, consisting of non-depleted p-type material, is thereby produced between depletion regions 44 and 46. Since metallurgical channel 48 lies below the upper surface of channel region 28, metallurgical channel 48 is a buried p channel through which holes flow from source 26 to drain 28.

The foregoing material provides a foundation for examining the operating of CJIGFET 20 in more detail. Moving to FIG. 3, it illustrates an expanded view of part of FIG. 1b rotated 90° for comparison with the idealized electric charge, electric field, and electric potential plots of FIGS. 4a–4c. $V_{FB}$ in FIG. 4c represents the flat-band voltage discussed below.

Figure 3:
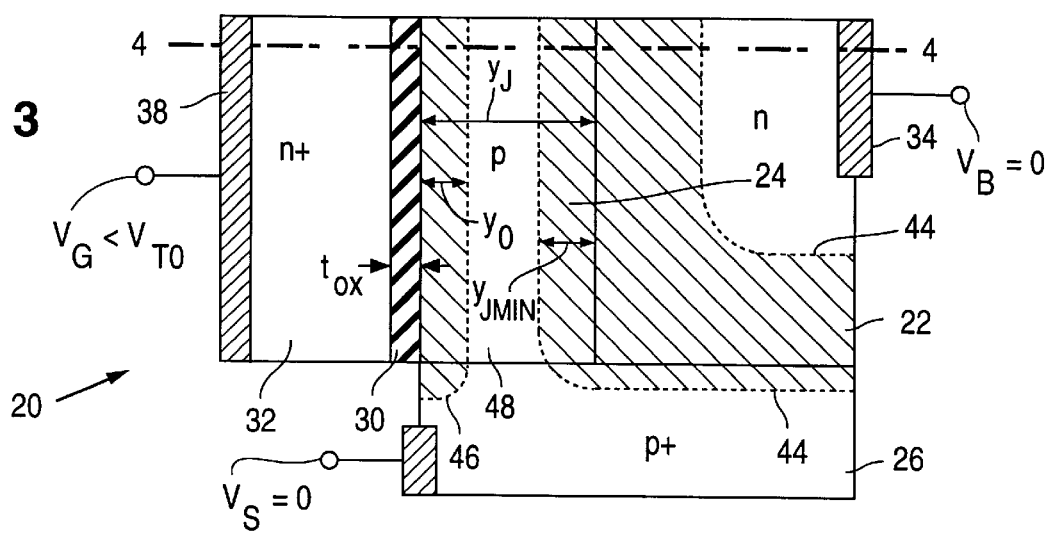
FIG. 3 is an enlarged view of part of FIG. 1b centered around the source of the CJIGFET and rotated one-quarter turn to match the orientation of FIGS. 4a, 4 b, and 4 c.

The threshold condition is determined from the model shown in FIG. 3 where source voltage $V_S$ is zero. Since gate voltage $V_{GS}$ thereby equals gate-to-source voltage $V_{GS}$, gate voltage $V_G$ is (for simplicity) utilized in the following analysis instead of gate-to-source voltage $V_{GS}$.

In the model of FIG. 3, channel region 24 is conductively connected to ground potential (0 V) at the source end through neutral metallurgical channel 48. Through this connection, channel region 24 receives a fixed potential close to ground reference. Any voltage applied to gate electrode 32 drops across the CJIGFET structure at the upper semiconductor surface. This justifies a quasi one-dimensional treatment in which gate voltage $V_G$ is considered to be referenced to channel region 24.

Figure 4A:
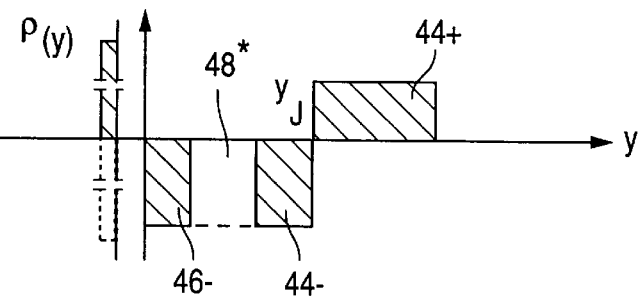
FIGS. 4a–4c a simplified curves for electric charge, electric field, and electric potential as a function of the depth into the semiconductor material for the CJIGFET of FIG. 1b. The curves of FIGS. 4a–4c are taken along plane 4—4 in FIG. 3, plane 4—4 generally extending through the center of the CJIGFET of FIG. 1b.
Figure 4B:
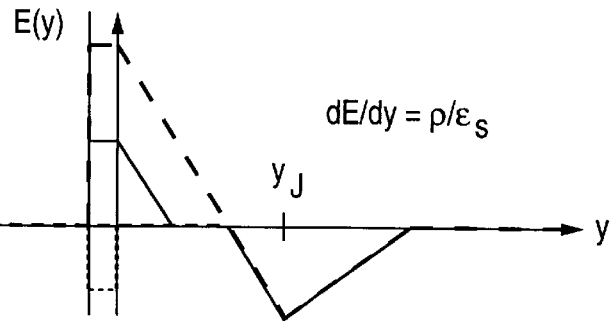
Figure 4C:
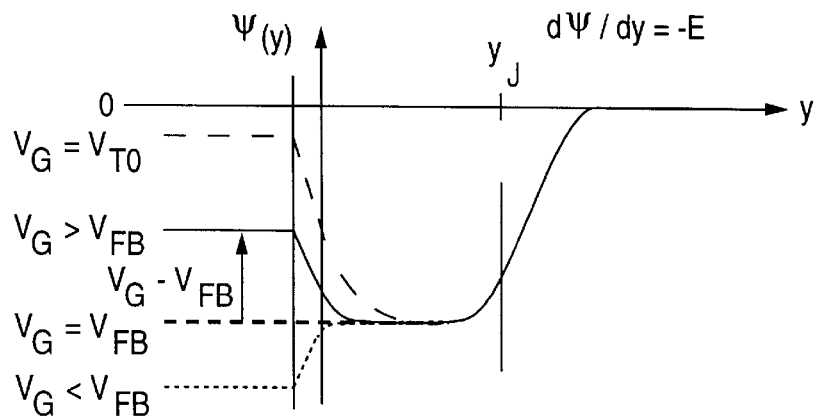

The distributions shown in FIGS. 4a–4c for charge p, electric field E, and electric potential ψ are represented in their evolution from an accumulation condition ($V_G < V_{FB}$) at the upper channel surface, through the flat-band condition ($V_G = V_{FB}$), through an intermediate condition ($V_{FB} < V_G < V_{T0}$), and to the threshold condition ($V_G = V_{T0}$). These distributions are coupled by the Poisson and potential relationships:

$$\frac{dE}{dy} = \frac{\rho}{\epsilon_S} \tag{6}$$

$$\frac{d\psi}{dy} = -E \tag{7}$$

where depth y is measured along the plane 4—4 in FIG. 3, and $\epsilon_S$ here is the permittivity of silicon, the semiconductor material.

The flat-band condition arises in an IGFET when gate voltage $V_G$ is at such a value that there is no electric field at the upper surface of the channel region. This value of gate voltage $V_G$ (or gate-to-source voltage $V_{GS}$ if source voltage $V_S$ is not zero) is the flatband voltage $V_{FB}$.

The determinant feature of metallurgical-channel CJIGFET 20 is that, when flat-band voltage $V_{FB}$ is applied to gate electrode 32, depletion region 44 of the channel/body junction extends freely into channel region 24 such that the channel-side depletion boundary does not reach the silicon/silicon-oxide interface at the upper semiconductor surface. This condition imposes a lower limit on the channel thickness for buried-channel operation to take place, namely that channel region 24 must be thicker than the channel-side portion of depletion region 44 along the channel/body junction at thermal equilibrium. In equation form, this condition is:

$$y_J \geq y_{JMIN} \tag{8}$$

where $y_{JMIN}$ is the thickness of the channel-side portion of depletion region 44 along the channel/body junction and thus is the minimum junction depth for buried-channel operation.

In order to determine channel-side channel/body depletion thickness $y_{JMIN}$, the center dopant profile of FIG. 2 is approximated by a center dopant profile in which local net dopant concentration N is at uniform value $N_B$ across the entire vertical extent of n body region 22 and in which local concentration N is at uniform value $N_C$ across the entire vertical extent of p channel region 24. A step change in dopant concentration therefore occurs in going across the channel/body junction. Applying the depletion approximation to this junction model, channel-side depletion thickness $y_{JMIN}$ can be expressed as:

$$y_{JMIN} = \left(\frac{N_B}{N_B + N_C}\right)\sqrt{\frac{2\epsilon_s|\Delta\psi_0|}{q}\left(\frac{1}{N_B} + \frac{1}{N_C}\right)} \tag{9}$$

$$= L_{D(C)}\sqrt{\frac{2\ln(N_B N_C/n_i^2)}{1 + N_C/N_B}}$$

where $n_i$ here is the intrinsic carrier concentration of silicon. $\Delta\psi_0$, the built-in voltage between p channel region 24 and n body region 22, is:

$$\Delta\psi_0 = -\left(\frac{kT}{q}\right)\ln\left(\frac{N_B N_C}{n_i^2}\right) \tag{10}$$

$L_{D(C)}$, the extrinsic Debye length calculated at the doping level $N_C$ of channel region 24 and chosen here as a natural normalization length, is:

$$L_{D(C)} = \sqrt{\frac{kT\epsilon_s}{q^2 N_C}} \tag{11}$$

Assuming that Eq. 9 is satisfied, long-channel threshold voltage $V_{T0}$ is calculated by imposing the condition that channel 48 is pinched off—i.e., the upper boundary of lower depletion region 44 touches the lower boundary of upper (surface) depletion region 46—when gate voltage $V_G$ equals $V_{T0}$. Depletion thickness $y_0$ of field-induced upper depletion region 46 at pinch-off is then given as:

$$y_0 = y_J - y_{JMIN} \tag{12}$$

In accordance with Grove cited above, surface depletion thickness $y_0$ can be expressed as a function of voltage $V_{T0}$ according to:

$$y_0 = \left(\frac{\epsilon_s}{C_{OX}}\right)\left(\sqrt{1 + \frac{2C_{OX}^2}{qN_C\epsilon_s}|V_{T0} - V_{FB}|} - 1\right) \tag{13}$$

where $C_{OX}$ is the gate oxide capacitance per unit area. $C_{OX}$ equals the dielectric permittivity $\epsilon_{OX}$ of gate oxide 30 divided by its thickness $t_{OX}$.

Flat-band voltage $V_{FB}$ in Eg. 13 is calculated conventionally for an IGFET structure whose substrate is doped at the level of the channel region. Letting $V_{FB(C)}$ represent flat-band voltage $V_{FB}$ when junction depth $y_j$ equals or exceeds $y_{JMIN}$, thick-channel flat-band voltage $V_{FB(C)}$ is:

$$V_{FB(C)} = \Phi_{M(POLY)} - \Phi_{S(C)} - \frac{Q_f}{C_{OX}} \tag{14}$$

$$= \Phi_{F(POLY)} - \Phi_{F(C)} - \frac{Q_f}{C_{OX}}$$

where $Q_f$ is the charge per unit area at the silicon-dioxide/silicon interface along the upper surface of channel region 24, $\Phi_{M(POLY)}$ is the polysilicon gate work function, $\Phi_{S(C)}$ is the channel work function, $\Phi_{F(POLY)}$ is the Fermi potential of neutral polysilicon gate electrode 32, and $\Phi_{F(C)}$ is the Fermi potential of channel region 24 when channel region 24 is sufficiently thick to avoid total channel pinch-off—i.e., $y_J$ is greater than $y_{JMIN}$. Fermi potentials $\Phi_{F(POLY)}$ and $\Phi_{F(C)}$ are:

$$\Phi_{F(POLY)} = -\left(\frac{kT}{q}\right)\ln\left(\frac{N_{POLY}}{n_i}\right) \tag{15}$$

$$\Phi_{F(C)} = \left(\frac{kT}{q}\right)\ln\left(\frac{N_C}{n_i}\right) \tag{16}$$

Note that Fermi potentials $\Phi_{F(POLY)}$ and $\Phi_{F(C)}$ here, as in Grove cited above, are equal in magnitude to, and opposite in sign from, the neutral region potentials, used in other literature. Combining Eqs. 12 and 13 results in the following value $V_{T0}{}^m$ of long-channel threshold voltage $V_{T0}$ for junction depth $y_j$ greater than or equal to $y_{JMIN}$:

$$V_{T0}^m = V_{FB(C)} + qN_C(y_J - y_{JMIN})\left(\frac{1}{C_{OX}} + \frac{y_J - y_{JMIN}}{2\epsilon_s}\right) \tag{17}$$

The upper limit $y_{JMAX}$ of channel depth $y_J$ for metallurgical-channel operation in CJIGFET 20 is determined by applying the inversion condition at the upper channel surface:

$$y_{JMAX} = y_{0INV} + y_{JMIN} \tag{18}$$

Thickness width $y_{0INV}$ of surface depletion region 46 at inversion is:

$$y_{0INV} = \sqrt{\frac{2\epsilon_s|2\Phi_{F(C)}|}{qN_C}} \tag{19}$$

Combining Eqs. 11, 18, and 19 results in:

$$y_{JMAX} = 2L_{D(C)}\sqrt{\ln(N_C/n_i)} + y_{JMIN} \tag{20}$$

If channel depth $y_J$ exceeds $y_{JMAX}$, channel region 24 cannot be pinched off regardless of the magnitude of voltage $V_G$ applied to gate electrode 32. CJIGFET 20 no longer functions as a normally off device.

1.3 Polysilicon-gate CJIGFET That Conducts Through a Surface Channel

Figure 5A:
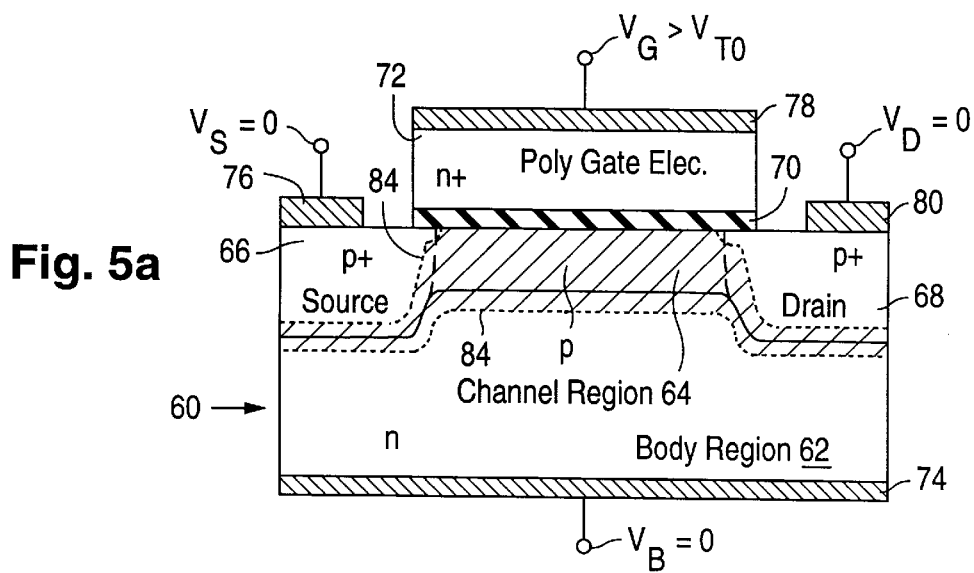
FIGS. 5a and 5b are cross-sectional views of a polysilicon-gate p-channel CJIGFET which conducts according to a surface-channel mechanism.
Figure 5B:
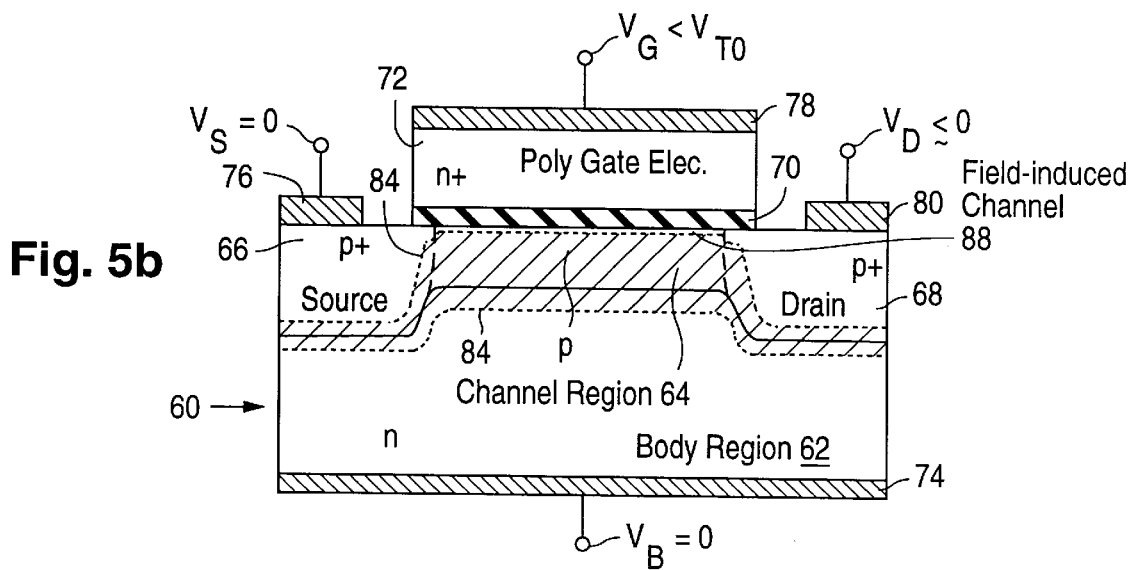

Another long-channel normally off polysilicon-gate p-channel CJIGFET 60 is illustrated in FIGS. 5a and 5b. FIG. 5a presents typical voltage/channel-depletion conditions for p-channel CJIGFET 60 when it is turned off. FIG. 5b presents typical voltage/channel-conduction conditions for CJIGFET 60 when it is turned on and operating in its linear range at a small magnitude of the drain-to-source voltage.

Similar to CJIGFET 20 of FIG. 1, CJIGFET 60 of FIGS. 5a and 5b (collectively "FIG. 5") is created from a mono-silicon semiconductor body having an n-type body region 62. CJIGFET 60 consists of a p-type channel region 64, a heavily doped p-type source zone 66, a heavily doped p-type drain zone 68, a thin thermally grown silicon oxide gate dielectric layer 70, and a heavily doped n-type polysilicon gate electrode 72 arranged respectively in the same way as p channel region 24, p+ source zone 26, p+ drain zone 28, gate oxide layer 30, and n+ polysilicon gate electrode 32 in CJIGFET 20. Body voltage $V_B$, source voltage $V_S$, and gate voltage $V_G$ are respectively applied to n body region 62, p+ source 66, and n+ polysilicon gate electrode 72 through metal contacts 74, 76, and 78. Drain voltage $V_D$ is taken from p+ drain 68 by way of a metal contact 80. As with CJIGFET 20, long-channel threshold voltage $V_{T0}$ of CJIGFET 60 is negative.

The difference between CJIGFETs 20 and 60 is the channel/body doping. CJIGFET 60 has a center channel/body vertical dopant profile of the type depicted in FIG. 6. The center dopant profile of CJIGFET 60 is somewhat similar to that of CJIGFET 20 and can be approximately represented by Eqs. 1–3. The reference symbols N, $N_{B0}$ and $N_{C0}$ in FIG. 6 have the same meaning as in FIG. 2. Eqs. 4 and 5 likewise apply to the dopant profile of FIG. 6. Curve segments 62* and 64* in FIG. 6 respectively indicate the net dopant concentrations in n body region 62 and p channel region 64.

Figure 6:
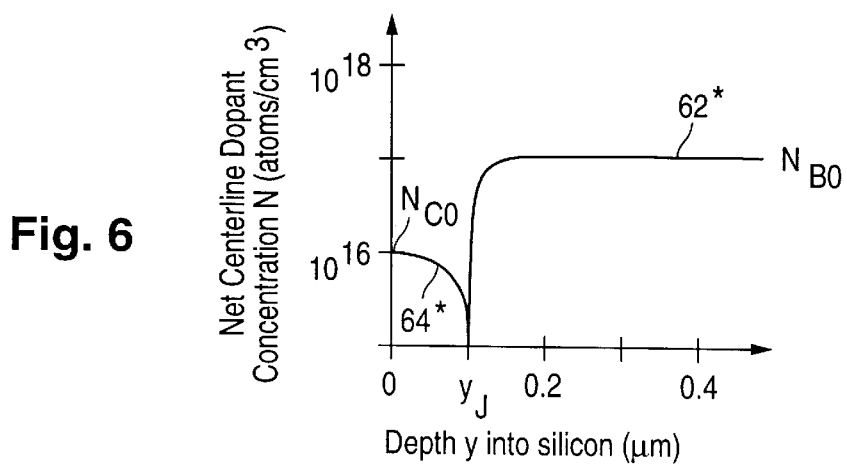
FIG. 6 is a graph of the net vertical dopant concentration through the center of the CJIGFET of FIGS. 5a and 5b.

The Gaussian center dopant profile of FIG. 6 is suitable for a device having a minimum-drawn gate length of 0.25–1 $\mu$m and a gate oxide thickness of 5–20 nm. The dopant profile of FIG. 6 could be produced in generally the same manner as the dopant profile of FIG. 2.

The difference between the two center dopant profiles is that net p-type channel surface dopant concentration $N_{C0}$ for CJIGFET 60 is typically less than net n-type background body dopant concentration $N_{B0}$ rather than being greater than $N_{BO}$ as is typically the case with CJIGFET 20. Long-channel threshold voltage $V_{T0}$ of CJIGFET 60 is approximately −1.1 V for the dopant profile of FIG. 6 at a typical gate oxide thickness of 10 nm. Taking note of the fact that long-channel threshold voltage $V_{T0}$ for CJIGFET 20 is approximately −0.6 V at the same gate oxide thickness (10 nm), threshold voltage $V_{T0}$ is of greater magnitude for CJIGFET 60 then for CJIGFET 20. A greater magnitude of gate-to-source voltage $V_{GS}$ is thus needed to achieve conduction in CJIGFET 60 than in CJIGFET 20.

A depletion region 84 extends vertically across the entire thickness of channel region 64 when CJIGFET 60 is at the non-conductive voltage conditions indicated in FIG. 5a. Since channel surface dopant concentration $N_{C0}$ is typically less than background body dopant concentration $N_{B0}$, depletion region 84 is due almost entirely to the body/channel pn junction.

Upon adjusting CJIGFET 60 to the conductive voltage conditions shown in FIG. 5b, the electric field produced by the change in gate-to-source voltage $V_{GS}$ from a value greater than $V_{T0}$ to a value less than $V_{T0}$ causes a conductive surface channel 88 to be induced in a thin layer along the upper surface of channel region 64. Field-induced surface channel 88, which extends laterally from p+ source 66 to p+ drain 68, substantially terminates the influence of gate voltage $V_G$ on depletion region 84. Depletion region 84 remains essentially fixed except that it now extends substantially up to surface channel 88. Contrary to what occurs in CJIGFET 20, no undepleted, p-type subsurface channel is produced in CJIGFET 60. This difference arises because p-type channel surface dopant concentration $N_{C0}$ is typically less than, rather than being greater than, n-type background body dopant concentration $N_{B0}$.

Figure 7:
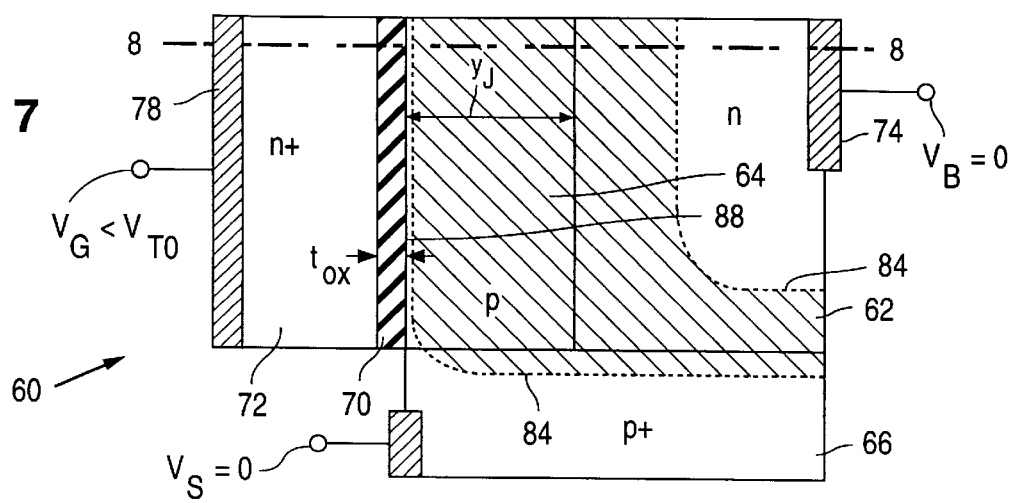
FIG. 7 is an enlarged view of part of FIG. 5b centered around the source of he CJIGFET and rotated one-quarter turn to match FIGS. 8a, 8b, and 8c.
Figure 8A:
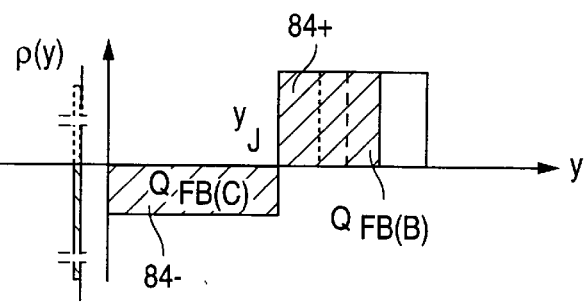
FIGS. 8a–8c are simplified curves for electric charge, electeric field, and electric potential as a function of the depth into the semiconductor material for the CJIGFET of FIG. 5b. The curves of FIGS. 8a–8c are taken along plane 8—8 in FIG. 7, plane 8—8 generally extending through the center of the CJIGFET of FIG. 5b.
Figure 8B:
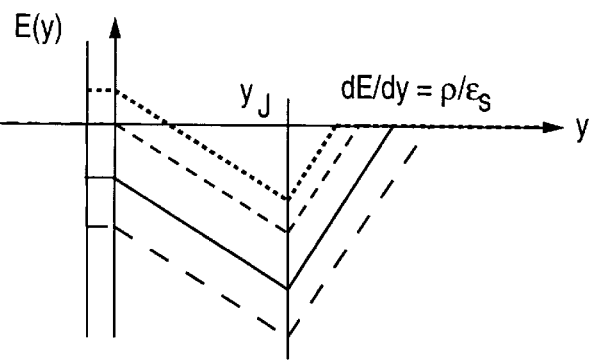
Figure 8C:
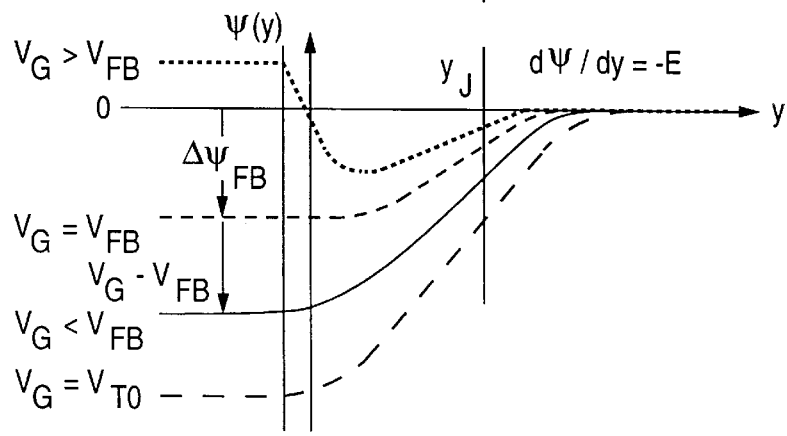

With the foregoing in mind, the operation of CJIGFET 60 is now examined in more detail. Turning to FIG. 7, it illustrates an expanded view of part of FIG. 5 rotated 90° for comparison with the idealized electric charge, electric field, and electric potential plots of FIGS. 8a–8c.

When channel depth $y_J$ is smaller than $y_{JMIN}$, which constitutes the lower limit for metallurgical-channel operation, a neutral layer of fixed potential cannot be produced in the channel region of a CJIGFET. The charge depletion region induced by the gate electrode along the upper surface of the channel region is vertically coupled through electric field with the channel-body depletion region into a single inseparable charge depletion region. This can be one-dimensional modelled using the structure of FIG. 7. The distributions shown in FIGS. 8a–8c for charge p, electric field E, and electric potential $\psi$ are presented in their evolution from an accumulation condition ($V_G > V_{FB}$), through the flat-band condition ($V_G = V_{FB}$), through an intermediate condition ($V_{T0} < V_G < V_{FB}$), and to the threshold condition ($V_G = V_{T0}$) using a representation similar to that used for metallurgical-channel CJIGFET 20.

A dominating feature of field-induced-channel CJIGFET 60 is that, under the flatband condition, the energy bands in silicon are not flat at thermal equilibrium. Although the electric field in gate oxide 70 is zero when flat-band voltage $V_{FB}$ is applied to gate electrode 72, the electric field is non-zero immediately below the upper surface of channel region 64. This gives rise to a finite flat-band built-in voltage $\Delta\psi_{FB}$ at the interface between gate oxide 70 and channel region 64. Built-in voltage $\Delta\psi_{FB}$ enters into flat-band voltage $V_{FB}$ and will be determined below using the depletion approximation.

Surface flat-band built-in voltage $\Delta\psi_{FB}$ can be calculated by observing that the zero surface electric field condition and Gauss's law require that the depletion charges $Q_{FB(B)}$ and $Q_{FB(C)}$ on the two sides of the channel/body junction compensate each other. That is, $$Q_{FB(B)} = Q_{FB(C)} 0 \tag{21}$$

Accordingly, the electrostatics of this structure are analogous to that of a pn junction at thermal equilibrium. Charge $Q_{FB(C)}$ on the channel side of the channel/body junction at the flat-band condition is fixed by junction depth $y_J$ at:

$$Q_{FB(C)} = -qN_C y_J \tag{22}$$

and determines the amount of depletion thickness $W_{FB(B)}$ needed on the body side of the channel/body junction at the flat-band condition to satisfy Eq. 21. Charge $Q_{FB(B)}$ on the body side of the channel/body junction of the flat-band condition is:

$$Q_{FB(B)} = qN_B W_{FB(B)} \tag{23}$$

To determine depletion thickness $W_{FB(B)}$, the center dopant profile of FIG. 6 is approximated by a center dopant profile in which the local dopant concentrations across n body region 62 and p channel region 64 are respectively at uniform values $N_B$ and $N_C$. Since the electrostatics of the structure of FIG. 7 are analogous to that of a pn junction at thermal equilibrium, $W_{FB(B)}$ and $\psi_{FB}$ can be respectively substituted for $y_{JMIN}$ and $\Delta\psi_0$ in Eq. 9 to produce:

$$W_{FB(B)} = \left(\frac{N_C}{N_B + N_C}\right)\sqrt{\frac{2\epsilon_s |\Delta\psi_{FB}|}{q}\left(\frac{1}{N_B} + \frac{1}{N_C}\right)} \tag{24}$$

After introducing Debye length normalization and applying the appropriate sign, flat-band built-in voltage $\Delta\psi_{FB}$ for junction depth $y_J$ less than or equal to $y_{JMIN}$ is:

$$\Delta\psi_{FB} = -\frac{1}{2}\left(\frac{kT}{q}\right)\left(\frac{y_J}{L_{D(C)}}\right)^2\left(1 + \frac{N_C}{N_B}\right) \tag{25}$$

where Debye normalization length $L_{D(C)}$ is given from Eq. 11. Eq. 25 approximates the flat-band value of the surface build-in voltage when junction depth $y_J$ is less than $y_{JMIN}$. When junction depth $y_J$ is greater than or equal to $y_{JMIN}$, flat-band build-in voltage $\Delta\psi_{FB}$ equals build-in voltage $\Delta\psi_0$ of a bulk pn junction. That is, $$\Delta\psi_{FB} = \Delta\psi_0 \tag{26}$$

where built-in pn-junction voltage $\Delta\psi_0$ is given from Eq. 10.

Figure 9:
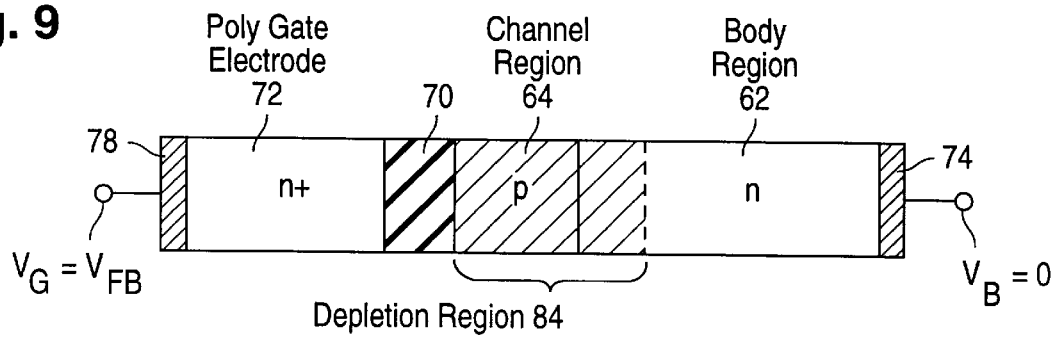
FIG. 9 is a one-dimensional slice of FIG. 7 and is therefore an enlarged view of a small part of the CJIGFET structure of FIG. 5b. The slice of FIG. 9 goes through plane 8—8 in FIG. 7.
Figure 10A:
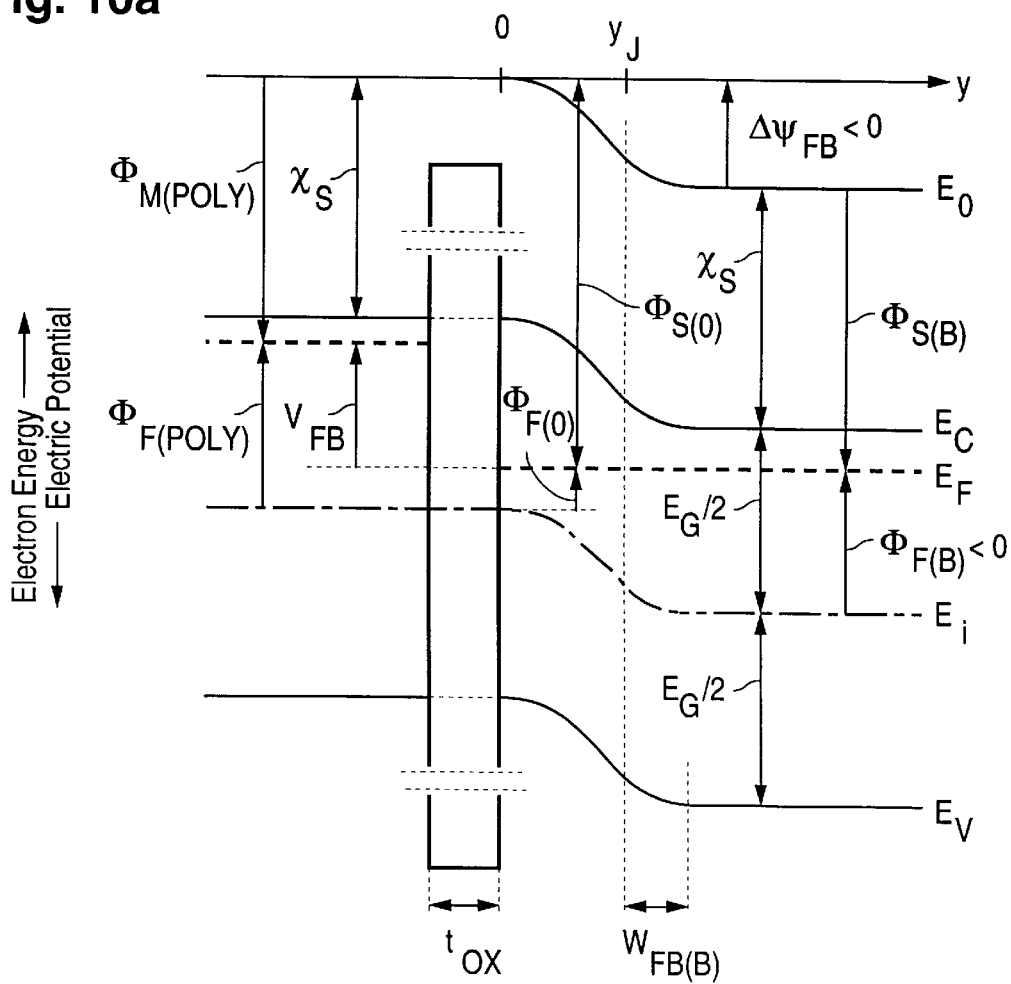
FIGS. 10a and 10b are simplified band diagrams respectively at the flat-band and inversion conditions for the CJIGFET slice of FIG. 9 and thus the polysilicon-gate CJIGFET of FIG. 5b, FIGS. 10a and 10b each present the work functions, Fermi potentials, and built-in potential.
Figure 10B:
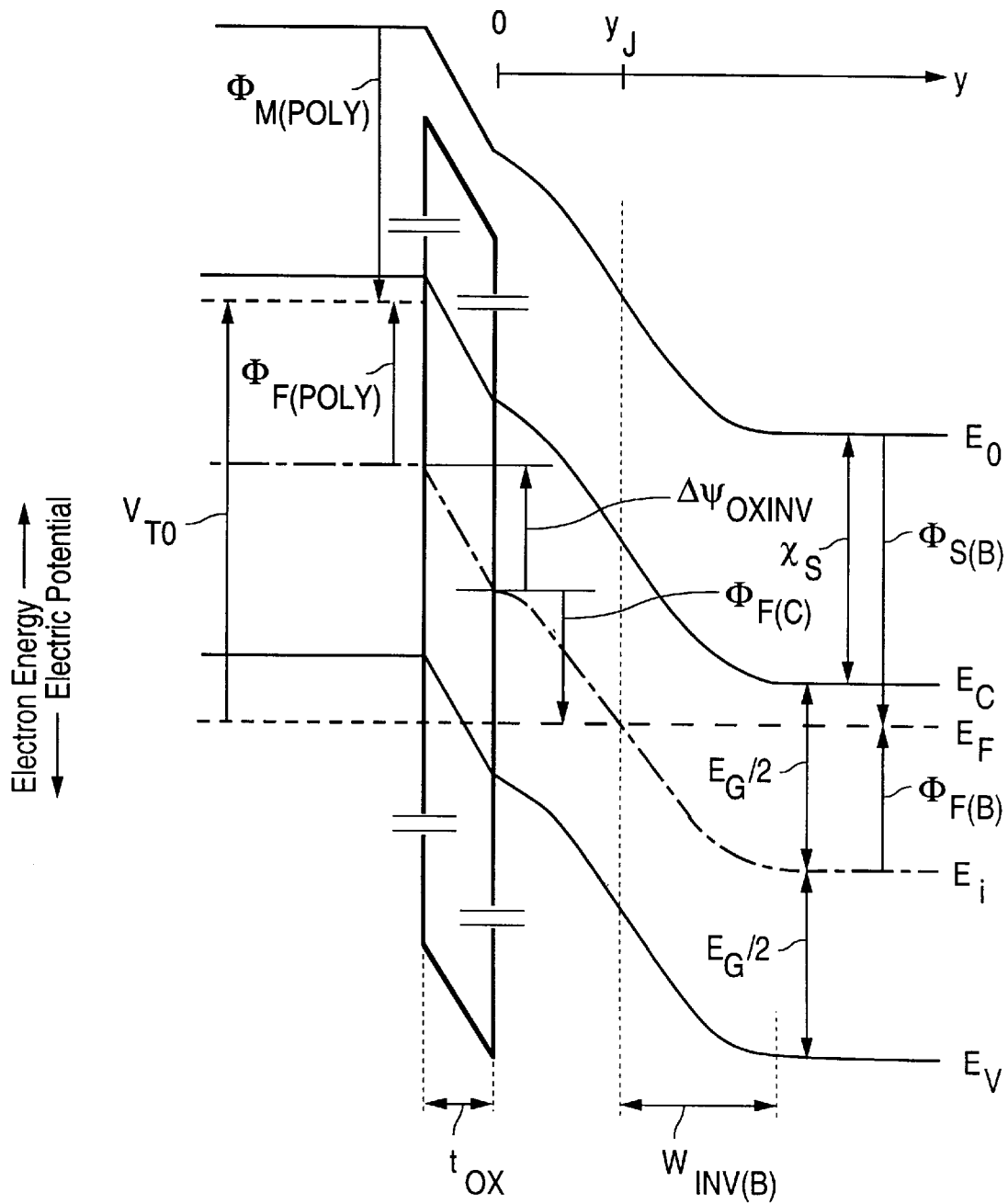

FIG. 9, which illustrates a one-dimensional slice of the portion of CJIGFET 60 shown in FIG. 7, is now used for performing a band analysis in conjunction with FIGS. 10a and 10b. FIG. 10a depicts the energy/potential bands at the flat-band condition. FIG. 10b depicts the energy/potential bands at the threshold condition where surface inversion occurs. In FIGS. 10a and 10b, $E_0$ is the vacuum reference energy, $E_i$ is the energy at the intrinsic Fermi level in silicon, $E_V$ is the energy at the edge of the conduction band in silicon, $E_C$ is the energy at the edge of the valence band in silicon, $E_G$ is the band-gap energy $E_C - E_V$ between the conduction and valence bands in silicon, and $\chi_S$ is the electron affinity of silicon.

Having determined flat-band built-in voltage $\Delta\psi_{FB}$, the value of flat-band voltage $V_{FB}$ itself is now calculated. Flat-band voltage $V_{FB}$ is the amount of electron energy, expressed in voltage units, by which the Fermi energy level in the gate material needs to be shifted in order to bring about the flat-band condition. With reference to FIGS. 9 and 10a, this value is:

$$V_{FB} = \Phi_{M(POLY)} - \Phi_{S(0)} - \frac{Q_f}{C_{OX}} \quad (27)$$

$$= \Phi_{F(POLY)} - \Phi_{F(0)} - \frac{Q_f}{C_{OX}}$$

where $\Phi_{S(0)}$ here is the silicon work function at the upper surface of channel region 64, and $\Phi_{F(0)}$ is the Fermi potential at the upper surface of channel region 64. Polysilicon gate Fermi potential $\Phi_{F(POLY)}$ is given from Eq. 15. Surface Fermi potential is given by:

$$\Phi_{F(0)} = \Phi_{F(B)} - \Delta\psi_{FB} \quad (28)$$

where $\Phi_{F(B)}$ is the Fermi potential in the electrically neutral bulk of body region 62:

$$\Phi_{F(B)} = -\left(\frac{kT}{q}\right)\ln\left(\frac{N_B}{n_i}\right) \quad (29)$$

Combining Eqs. 27 and 28 yields:

$$V_{FB} = \Phi_{F(POLY)} - \Phi_{F(B)} + \Delta\psi_{FB} - \frac{Q_f}{C_{OX}} \quad (30)$$

where flat-band built-in voltage $\Delta\psi_{FB}$ is given by Eq. 25.

Note that the electron affinity $\chi_S$ of silicon generally contributes to the flat-band voltage determination. However, the electron affinity of silicon does not enter these calculations because it is assumed that the electron affinity of the polysilicon in gate electrode 72 is the same as that of the bulk silicon in the semiconductor body.

Observe that body Fermi potential $\Phi_{F(B)}$ for field-induced-channel CJIGFET 60 is negative whereas channel Fermi potential $\Phi_{\Phi F(C)}$ for metallurgical-channel CJIGFET 20 is positive. Also, $$\Phi_{F(B)} - \Phi_{F(C)} < \Delta\psi_{FB} < 0 \quad (31)$$

Accordingly, flat-band voltage $V_{FB}$ calculated from Eq. 30 for CJIGFET 60 is always more positive than that determined from Eq. 14 for CJIGFET 20 using channel Fermi potential $\Phi_{F(C)}$ with no built-in voltage. Hence, field-induced-channel CJIGFET 60, although operating generally like a surface-channel IGFET, has a subtle flat-band voltage determination.

Analogous to the $V_{FB}$ determination for CJIGFET 60, determination of long-channel threshold voltage $V_{T0}$ for CJIGFET 60 involves a number of subtleties. Starting from the flat-band condition, where the silicon energy bands are already bent toward the depletion/inversion direction, additional negative bias needs to be applied to gate electrode 72 in order to further bend the bands to a strong inversion condition. This is shown in FIG. 10b.

As discussed further below, field-induced-channel CJIGFET 60 crosses over into metallurgical channel CJIGFET 20 as net n-type background body dopant concentration $N_{B0}$ is reduced and/or net p-type channel surface dopant concentration $N_{C0}$ is increased. The strong inversion condition customarily imposed on the surface potential is quite straightforward, and will be used here in a slightly modified form to ensure threshold voltage continuity between CJIG-FETs 20 and 60.

Rather than impose the conventional $2\Phi_{F(B)}$ band bending, the condition that the band bending at strong inversion equal the absolute-value sum of positive body Fermi potential $\Phi_{F(B)}$ and negative channel Fermi potential $\Phi_{F(C)}$ is used here:

$$\Delta\Phi_{INV} = \Phi_{F(B)} - \Phi_{F(C)} \quad (32)$$

where $\Delta\Phi_{INV}$ is the inversion voltage drop between gate oxide 70 and channel region 64. In this way, when field-induced-channel CJIGFET 60 changes into metallurgical-channel CJIGFET 20 at the boundary between the two operating regimes, the inversion condition sets the hole concentration at the upper semiconductor surface equal to the hole concentration in the neutral channel region—i.e., to exactly the channel carrier concentration of metallurgical-channel CJIGFET 20. This imposes a degree of inversion which, depending on the channel doping, can be more severe ($N_B > N_C$) or less severe ($N_C < N_B$) than the degree of inversion arising with the conventional $2\Phi_{F(B)}$ band bending.

The threshold voltage has to provide the additional band bending $\Delta\psi_{INV} - \Delta\psi_{FB}$ needed in silicon to reach the strong inversion condition of Eq. 32 for CJIGFET 60, and also to support the voltage drop across gate oxide 70 due to the uncompensated charge created by depletion in body region 64:

$$V_{T0} - V_{FB} = \Delta\psi_{INV} - \Delta\psi_{FB} - \frac{1}{C_{OX}}(Q_{INV(B)} - Q_{FB(B)}) \quad (33)$$

where $Q_{INV(B)}$ is the body-side charge of depletion region 84 along the channel/body junction at inversion. Inversion charge $Q_{INV(B)}$ on the body side of depletion region 84 is:

$$Q_{INV(B)} = qN_B W_{INV(B)} \quad (34)$$

where $W_{INV(B)}$ is the thickness of the body-side portion of depletion region 84 at inversion. From Eqs. 21–23, body-side charge $Q_{FB(B)}$ of depletion region 84 at the flat-band condition is:

$$Q_{FB(B)} = qN_B W_{FB(B)} \quad (35)$$

$$= qN_C y_J$$

Body-side inversion depletion thickness $W_{INV(B)}$ in Eq. 34 is determined from the condition that depletion region 84 support imposed voltage drop $\Delta\psi_{INV}$. When long-channel threshold voltage $V_{T0}$ is less than $V_{FB}$, note that the channel-body structure functions differently from a conventional bulk junction in the sense that the thickness $y_J$ of the channel side of depletion region 84 is constant. For this surface-terminated pn junction, body-side inversion depletion thickness $W_{INV(B)}$ can be demonstrated to be:

$$W_{INV(B)} = \sqrt{\frac{2\epsilon_S |\Delta\psi_{INV}|}{qN_B} + y_J^2\left(1 + \frac{N_C}{N_B}\right)} - y_J \quad (36)$$

Body-side thickness $W_{FB(B)}$ of depletion region 84 at the flat-band condition is given by a similar expression:

$$W_{FB(B)} = \sqrt{\frac{2\epsilon_S |\Delta\psi_{FB}|}{qN_B} + y_J^2\left(1 + \frac{N_C}{N_B}\right)} - y_J \quad (37)$$

Combining Eqs. 33–37 results in the following value $V_{T0}^f$ of long-channel threshold voltage $V_{T0}$ for junction depth $y_J$ less than or equal to $y_{JMIN}$:

$$V_{T0}^f = V_{FB} + \Delta\psi_{INV} - \Delta\psi_{FB} - \frac{qN_B}{C_{OX}} \left[ \sqrt{\frac{2\epsilon_S|\Delta\psi_{INV}|}{qN_B} + y_J^2\left(1 + \frac{N_C}{N_B}\right)} - \sqrt{\frac{2\epsilon_S|\Delta\psi_{FB}|}{qN_B} + y_J^2\left(1 + \frac{N_C}{N_B}\right)} \right] \quad (38)$$

By combining Eqs. 14, 30, and 32, flat-band voltage $V_{FB}$ for junction depth $y_J$ less than or equal to $y_{JMIN}$ can be expressed as:

$$V_{FB} = V_{FB(C)} - \Delta\psi_{INV} + \Delta\psi_{FB} \quad (39)$$

where $V_{FB(C)}$ is the flat-band voltage for the thick channel condition in which junction depth $y_J$ equals or exceeds $y_{JMIN}$. By using Eq. 39 to switch $V_{FB(C)}$ for $V_{FB}$ and by using Eqs. 11 and 25 to simplify the last term in Eq. 38, the $V_{T0}^f$ expression can be rewritten as:

$$V_{T0}^f = \quad (40)$$
$$V_{FB(C)} - \left(\frac{qN_B}{C_{OX}}\right)\sqrt{\frac{2\epsilon_S|\Delta\psi_{INV}|}{qN_B} + y_J^2\left(1 + \frac{N_C}{N_B}\right)} + \frac{q(N_B + N_C)y_J}{C_{OX}}$$

Given by Eq. 14, parameter $V_{FB(C)}$ in Eq. 40 is a convenient design quantity that combines the band bending in silicon, the work-function difference between the polysilicon gate and the channel region, and the threshold voltage shift due to fixed interface charge $Q_f$. Thick-channel flat-band voltage $V_{FB(C)}$ differs from the thin-channel value of flat-band voltage $V_{FB}$ specified in Eq. 30.

Eq. 40 is simpler and more practical than physically more explicit Eq. 39. Eq. 40 suggests that it is possible to calculate thin-channel threshold voltage $V_{T0}^f$ without making use of true flat-band voltage $V_{FB}$. This is indeed the case.

By using the inversion band diagram of FIG. 10b, the $V_{T0}^f$ threshold voltage expression is derived by inspection—i.e., without making use of the flat-band voltage definition—as:

$$V_{T0}^f = \Phi_{F(POLY)} - \Phi_{F(C)} - \frac{Q_f}{C_{OX}} + \Delta\psi_{OXINV} \quad (41)$$

where $\Delta\psi_{OXINV}$ is the voltage drop across gate oxide 70 at inversion. Oxide voltage drop $\Delta\psi_{OXINV}$ at inversion is:

$$\Delta\psi_{OXINV} = -\left[\frac{qN_BW_{INV(B)} - qN_Cy_J}{C_{OX}}\right] \quad (42)$$

Combining Eqs. 14, 36, 41 and 42 yields thin-channel threshold voltage $V_{T0}^f$ of Eq. 40.

Eq. 40, which specifies thin-channel threshold voltage $V_{T0}^f$ for field-induced channel CJIGFET 60, is consistent with Eq. 17, which specifies thick-channel threshold voltage $V_{T0}^m$ for metallurgical-channel CJIGFET 20. At the crossover location (or boundary) where the characteristics of CJIGFETs 20 and 60 merge, junction depth $y_J$ equals $y_{JMIN}$. Substituting this value of junction depth $y_J$ into Eqs. 17 and 40 yields:

$$V_{T0} = V_{T0}^m = V_{T0}^f = V_{FB(C)}, \; y_J = y_{JMIN} \quad (43)$$

at the crossover location. Alternatively, Eq. 43 can be derived directly from Eqs. 14 and 41 by observing that oxide voltage drop $\Delta\psi_{OXINV}$ at inversion is zero at the crossover location.

To better see the advantages of the present complementary-CJIGFET architecture, it is helpful to compare field-induced-channel CJIGFET 60 to a conventional surface-channel IGFET. As indicated above, the source-to-drain conduction mechanism in both CIJIGFET 60 and the surface-channel IGFET is a surface channel. The difference between the two types of IGFETs is that the channel region is of the same conductivity type as the source and drain in field-induced-channel CIJIGFET 60 but is of opposite conductivity type to the source and drain in the surface-channel IGFET.

Consider a p-channel surface-channel IGFET created from a uniformly doped n-type body region of a monosilicon semiconductor body, and provided with a heavily doped polysilicon gate electrode. The n-type body region merges into an n-type channel region that extends between a heavily doped p-type source and a heavily doped p-type drain. When the surface-channel IGFET is conductive, a p-type surface channel is created by inverting a surface layer of the n-type channel region.

Assume, as is typically the case when a p-channel surface-channel IGFET is combined with an n-channel IGFET in a complementary-IGFET architecture, that n-type dopant is introduced into the channel region of the surface-channel IGFET to adjust its threshold voltage. Further assume that the threshold-adjust implant is present in the channel region at a uniform dopant concentration $N_T$. Using the terminology employed above, long-channel threshold voltage $V_{T0}$ of the p-channel surface-channel IGFET is:

$$V_{T0} = V_{FB(B\&C)} - |\Delta\psi_{INV}| - \frac{q(N_B + N_T)}{C_{OX}}\sqrt{\frac{2\epsilon_S|\Delta\psi_{INV}|}{qN_B}} \quad (44)$$

where $V_{FB(B\&C)}$ is the flat-band voltage of the channel region—i.e., the portion of the body region constituted with the channel region. Channel flat-band voltage $V_{FB(B\&C)}$ is:

$$V_{FB(B\&C)} = \Phi_{M(POLY)} - \Phi_{S(B\&C)} - \frac{Q_f}{C_{OX}} \quad (45)$$
$$= \Phi_{F(POLY)} - \Phi_{F(B\&C)} - \frac{Q_f}{C_{OX}}$$

where $\Phi_{S(B\&C)}$ is the work function of the semiconductor material at the upper surface of the channel region, and $\Phi_{F(B\&C)}$ is the Fermi potential at the upper surface of the channel region. Surface Fermi potential $\Phi_{F(B\&C)}$ is, in turn, given as:

$$\Phi_{F(B)} = -\left(\frac{kT}{q}\right)\ln\left(\frac{N_B + N_T}{n_i}\right) \quad (46)$$

While the assumption of a uniform concentration of the threshold-adjust dopant has been employed in developing Eqs. 44–46, these equations are approximately applicable to a conventional threshold-adjust implant in which the concentration of a threshold-adjust dopant is nonuniform, provided that the depth of the threshold-adjust implant is greater than the depth of the surface depletion region. This condition is typically met in state-of-the-art complementary-IGFET applications.

Note that the threshold-adjust implant in a p-channel surface-channel IGFET controls long-channel threshold voltage $V_{T0}$ in a positive way. That is, the $V_{T0}$ magnitude increases as threshold-adjust dopant concentration $N_T$ increases. On the other hand, the channel doping in p-channel CJIGFET 60 controls long-channel threshold $V_{T0}$ in a negative way—i.e., the $V_{T0}$ magnitude decreases as channel dopant concentration $N_C$ increases.

1.4 Crossover Characteristics of Polysilicon-gate CJIGFETs

The crossover characteristics of CJIGFET 20 and 60 are of special interest. Crossover here refers to the regime of parameter values at which a metallurgical-channel CJIGFET, such as p-channel CJIGFET 20, transitions into a field-induced-channel CJIGFET, such as p-channel CJIGFET 60, and vice versa. In other words, crossover is the boundary between field-induced-channel operation and metallurgical-channel operation for a CJIGFET.

Figure 11A:
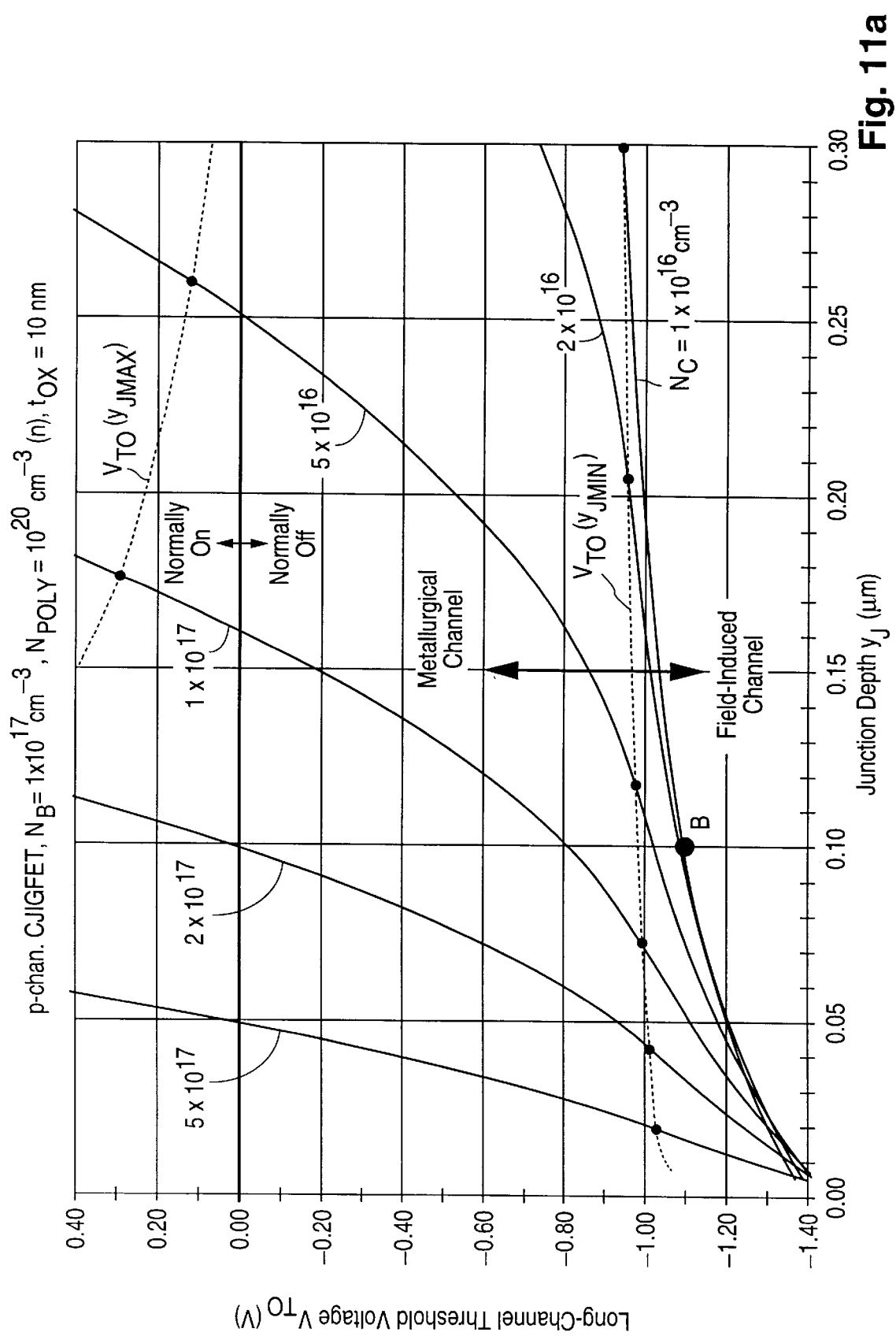
FIGS. 11a and 11b are full range design charts for the long-channel threshold voltage of a simplified polysilicon-gate p-channel CJIGFET as the channel junction depth and the channel dopant concentration are varied to cover both operation in which conduction occurs by a buried-channel mechanism and operation in which conduction occurs by a surface-channel mechanism.
Figure 11B:
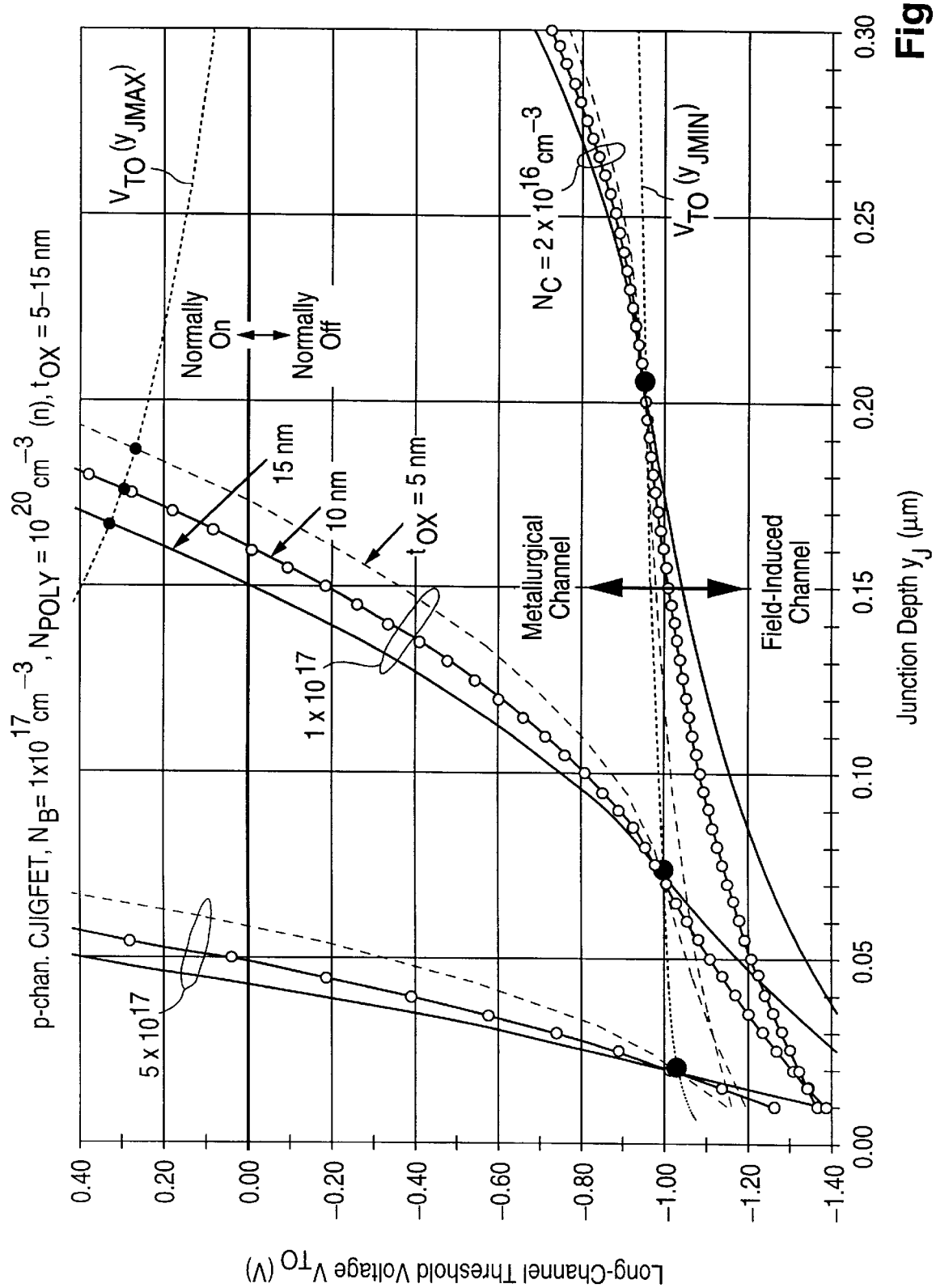

FIGS. 11a and 11b present examples of full-range design charts that illustrate the crossover characteristics for p-channel metallurgical-channel CJIGFET 20 and p-channel field-induced-channel CJIGFET 60. Body dopant concentration $N_B$, here again considered to be constant across the thickness of the body region, and polysilicon gate dopant concentration $N_{POLY}$ are both at fixed values in the design charts of FIGS. 11a and 11b. In particular, $N_B$ is $10^{17}$ atoms/cm$^3$ n-type while $N_{POLY}$ is $10^{20}$ atoms/cm$^3$ p-type. In FIGS. 11a and 11b, long-channel threshold voltage $V_{T0}$ is illustrated as a function of junction depth $y_J$ for exemplary values of channel dopant concentration $N_C$, here again considered to be constant across the depth of the channel region. FIG. 11a presents $V_{T0}$-$y_J$ curves for six different values of channel dopant concentration $N_C$. FIG. 11b presents $V_{T0}$-$y_J$ curves for three different values of channel dopant concentration $N_C$ at each of three different values of gate oxide thickness $t_{OX}$.

The $V_{T0}$-$y_J$ curves of FIGS. 11a and 11b are calculated from Eqs. 17 and 40. The lower and upper limits of metallurgical-channel operation for CJIGFET 20 are respectively indicated by the dotted lines marked $V_{T0}(y_{JMIN})$ and $V_{T0}(y_{MAX})$ in FIGS. 11a and 11b. Note that the values of threshold voltage $V_{T0}$ at maximum junction depth $y_{MAX}$ for metallurgical-channel (i.e., buried-channel) operation extend into the operation regime where a metallurgical-channel CJIGFET is a normally on device. The field-induced channel operation of CJIGFET 60 occurs in the parameter region below the $VT_{T0}(y_{JMIN})$ dotted line. Consequently, the $V_{T0}(y_{JMIN})$ line is the crossover boundary between metallurgical-channel operation and field-induced-channel operation. The $V_{T0}$-$y_J$ curves makes smooth, seamless transitions in going from metallurgical-channel operation to field-induced-channel operation, and vice versa.

Eqs. 17 and 40 apply specifically to models in which the channel dopant concentration is constant across the vertical extent of the p-channel region (24 or 64) and in which the body dopant concentration is constant across the vertical extent of the n body region (22 or 62). That is, there are step changes in the dopant concentrations along the channel/body pn junctions. The full-range design charts of FIGS. 11a and 11b therefore specifically apply to CJIGFETs in which a step change, rather than a smooth transition, occurs in the dopant concentration at the channel-body junctions.

In the center dopant concentration profile of a real CJIGFET, the body and channel dopant concentrations vary continuously as a function of depth y in the vicinity of the channel/body junction. The foregoing $V_{T0}$ analysis can be applied to a real center dopant profile by replacing uniform dopant concentrations $N_B$ and $N_C$ respectively with average net body dopant concentration $\overline{N}_B$ and average net channel dopant concentration $\overline{N}_C$. The approach taken here is to fit the analytical formulas for step pn junctions to numerical data for the Gaussian profiles of Eq. 3 by inserting appropriately determined values of average dopant concentrations $\overline{N}_B$ and $\overline{N}_C$ into Eqs. 17 and 40. The step-junction analytical models can then be used in conjunction with concentrations $\overline{N}_B$ and $\overline{N}_C$ to assess the characteristics, including the crossover characteristics, of a CJIGFET with a real center dopant profile.

The numerical accuracy of the analysis depends on the technique used to determine average dopant concentrations $\overline{N}_B$ and $\overline{N}_C$ for use in Eqs. 17 and 40. Accordingly, the averaging technique must be carefully chosen.

For p channel region 24 or 64, average net channel dopant concentration $\overline{N}_C$ can be defined unambiguously as the average of local net channel dopant concentration N, given by Eq. 3, over the region between the upper semiconductor surface and the channel/body junction:

$$\overline{N}_C = \frac{1}{y_J} \int_0^{y_J} \left( N_0 e^{(-y/L_C)^2} - N_{B0} \right) d y \tag{47}$$

where Gaussian length $L_C$ of the channel profile is given by Eq. 5. Using the definition of the error function, Eq. 47 can be rewritten in normalized form as $$\frac{\overline{N}_C}{N_0} = \frac{\sqrt{\pi}}{2} \frac{\text{erf}(\sqrt{\ln(N_0/N_{B0})})}{\sqrt{\ln(N_0/N_{B0})}} - \frac{N_{B0}}{N_0} \tag{48}$$

where erf is the error function.

For metallurgical-channel CJIGFET 20 whose threshold voltage $V_{T0}^f$ is given by Eq. 17, the effective average net body dopant concentration $\overline{N}_B^m$ is determined by extracting the value which yields the numerically calculated threshold voltage—i.e., by solving the following relationship for average body dopant concentration $\overline{N}_B^m$:

$$V_{T0}^m(\overline{N}_B^m, \overline{N}_C, y_J) = V_{T0}^{sim}, \; y_J > y_{JMIN}(N_{B0}, N_{C0}) \tag{49}$$

where average channel dopant concentration $\overline{N}_C$ is given by Eq. 48, and $V_{T0}^{sim}$ is the simulated threshold voltage. The results of this type of fitting show that effective average body dopant concentration $\overline{N}_B^m$ for metallurgical-channel CJIGFET 20 is relatively independent of junction depth $y_J$. Empirically, constant value $\overline{N}_B^m$ can be fit by:

$$\overline{N}_B^m = N_{B0} \ln \sqrt{N_0/N_{B0}} \tag{50}$$

A different type of averaging is used for threshold voltage $V_{T0}^f$ of field-induced-channel CJIGFET 60. The effective average net body dopant concentration $\overline{N}_B^f$ in body region 62 is approximately independent of junction depth $y_J$ when the extraction is performed using net channel surface dopant concentration $N_{C0}$ instead of average channel dopant concentration $\overline{N}_C$—i.e., by solving the following relationship for average body dopant concentration $\overline{N}_B^f$:

$$V_{T0}^f(\overline{N}_B^f, N_{C0}, y_J) = V_{T0}^{sim}, \; y_J < y_{JMIN}(N_{B0}, N_{C0}) \tag{51}$$

where threshold voltage $V_{T0}^f$ is given from Eq. 40. Effective average body dopant concentration $\overline{N}_B^f$ for CJIGFET 60 can be fit by:

$$\overline{N}_B^f = 10^{17}\left(\frac{N_{CO}}{10^{15}}\right)^{A_1 + A_2 \ln N_{BO}} \quad (52)$$

where $A_1$ and $A_2$ are constants respectively equal to -5.71 and 0.15.

Since the formulas and averaging methods are different for CJIGFETs 20 and 60, the fitted values of threshold voltages $V_{T0}^m$ and for $V_{T0}^f$ are slightly discontinuous at depth $y_J$ equal to junction depth $y_{JMIN}$. Corresponding threshold voltage curves are matched by shifting each curve by half of the discontinuity $\delta$ at junction $y_{JMIN}(N_{BO}, N_{CO})$:

$$\delta = V_{T0}^m(\overline{N}_B^m, \overline{N}_C, y_J) - V_{T0}^f(\overline{N}_B^f, N_{CO}, y_J) \quad (53)$$

The final result of the fitting is:

$$V_{T0}(N_{BO}, N_{CO}, y_J) = \begin{cases} V_{T0}^f(\overline{N}_B^f, N_{CO}, y_J), y_J < y_{JMIN}(N_{BO}, N_{CO}) \\ V_{T0}^m(\overline{N}_B^m, (\overline{N}_C, y_J), y_J \geq y_{JMIN}(N_{BO}, N_{CO}) \end{cases} \quad (54)$$

Figure 12A:
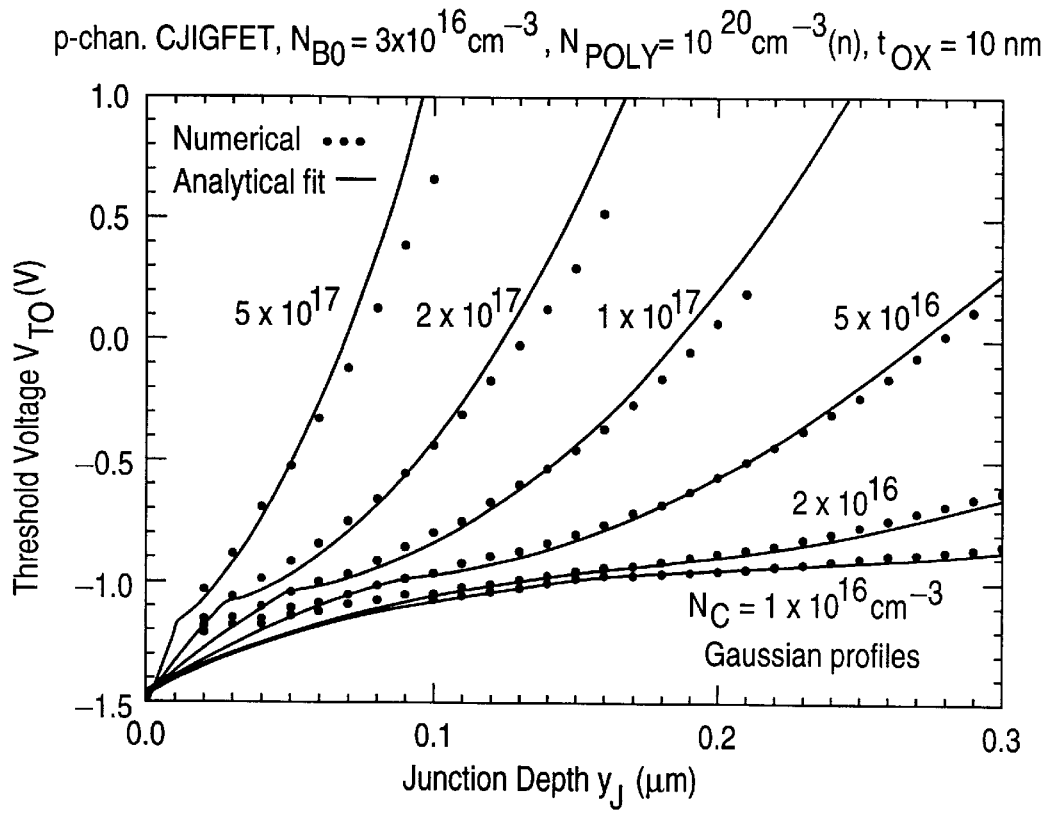
FIGS. 12a, 12b, and 12c are full-range design charts that compare the long-channel threshold voltage of a simplified polysilicon-gate p-channel CJIGFET to the long-channel threshold voltage of a more realistic polysilicon-gate p-channel CJIGFET as a function of channel junction depth, channel dopant concentration, and background body dopant concentration.
Figure 12B:
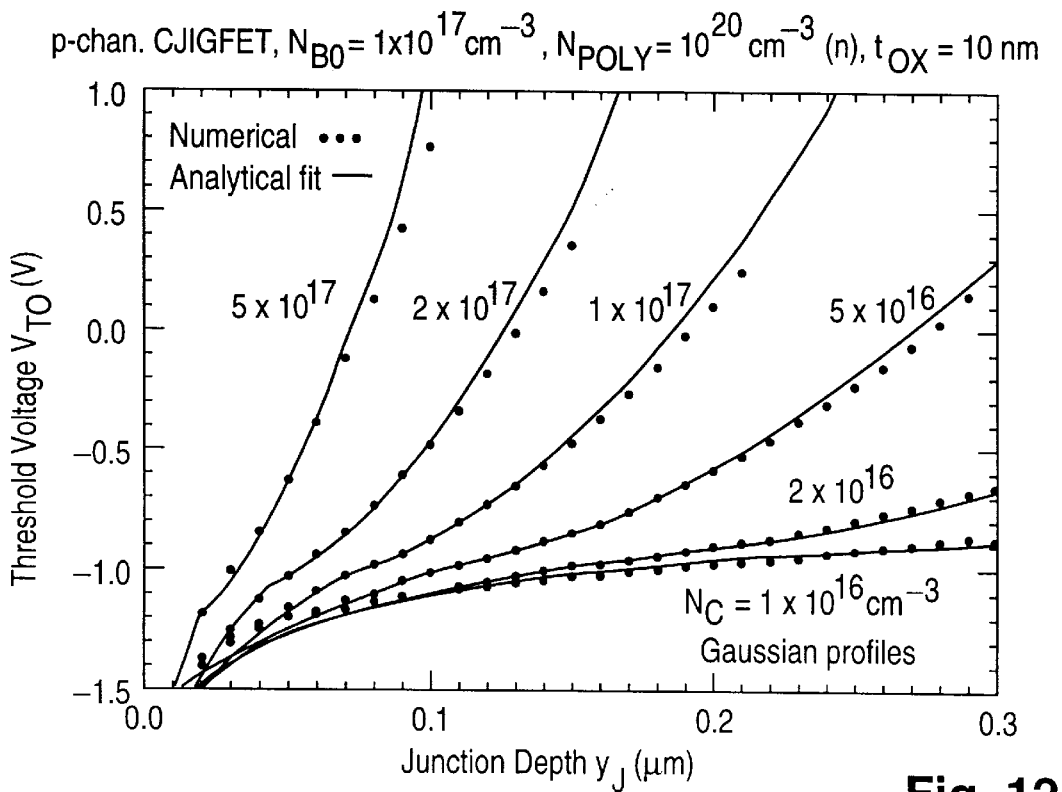
Figure 12C:
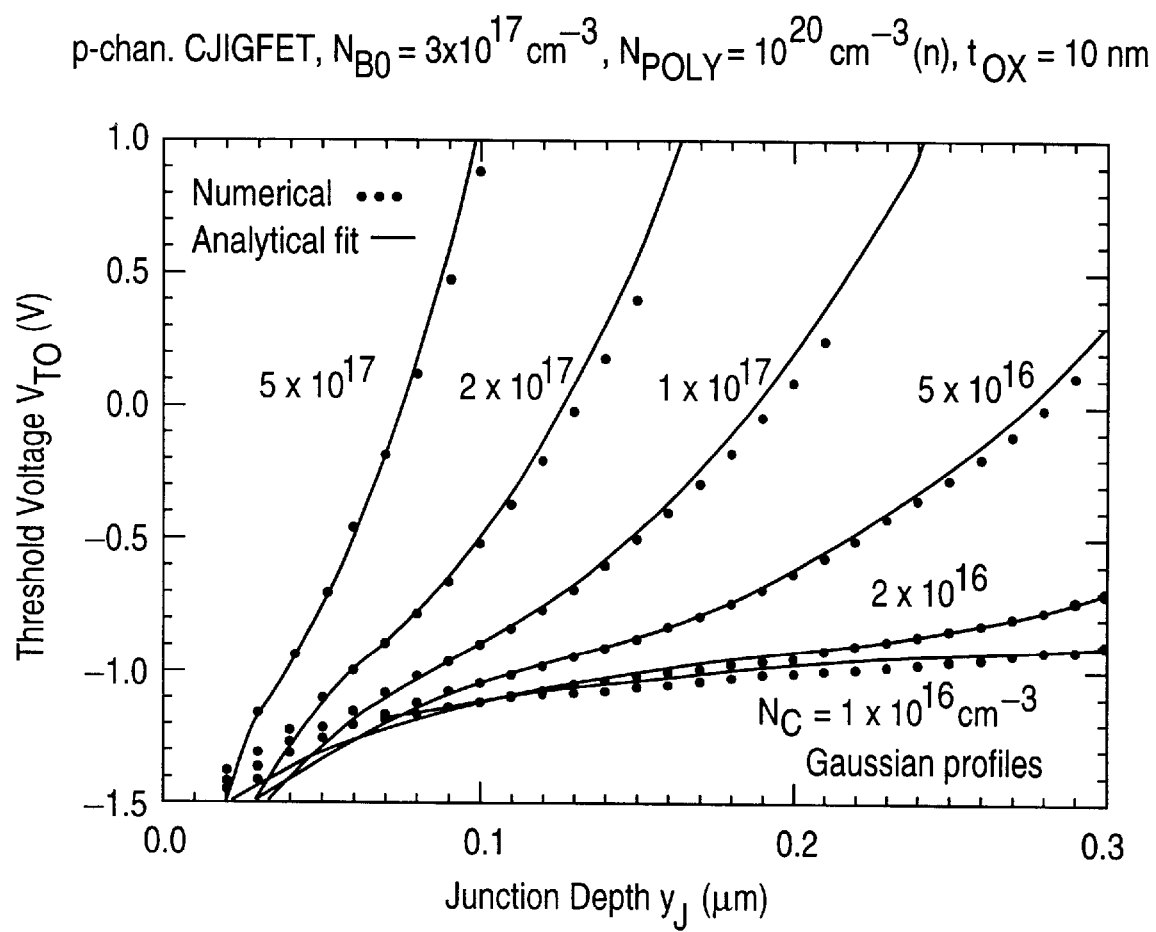

The degree of fitness obtained in this manner is illustrated in FIGS. 12a–12c for three different values of background body dopant concentration $N_{BO}$.

The $V_{T0}$-$y_J$ curves in FIGS. 11a and 11b and 12a–12c can be used at any value of net dopant concentration $N_{POLY}$ in polysilicon gate electrode 32 or 72 by shifting long-channel threshold voltage $V_{T0}$ according to:

$$V_{T0}(N_{POLY}) = V_{T0}(10^{20}) - \left(\frac{kT}{q}\right)\ln\left(\frac{N_{POLY}}{10^{20}}\right) \quad (55)$$

where $V_{T0}(N_{POLY})$ is the value of threshold voltage $V_{T0}$ at an arbitrary value of polysilicon gate dopant concentration $N_{POLY}$ in atoms/cm$^3$, and $V_{T0}(10^{20})$ is the value of threshold voltage $V_{T0}$ taken from any of FIGS. 11a and 11b and 12a–12c. Depletion in polysilicon gate electrode 32 or 72 does not limit the validity of any the preceding design equations because the surface electric field during conduction is negative, thereby causing accumulation to occur in the n-type polysilicon gate material.

An advantage of a CJIGFET is that its sensitivity to changes in gate oxide thickness $t_{OX}$ is relatively low, particularly near the crossover boundary between metallurgical-channel and field-induced-channel operation. Taking note of the fact that gate oxide capacitance $C_{OX}$ per unit area equals gate oxide thickness $t_{OX}$ divided by silicon permittivity $\in_S$, the $V_{T0}$ dependance on gate oxide thickness $t_{OX}$ in Eq. 40 for field-induced-channel operation arises from (a) the $V_{FB(C)}$ flat-band term which, by way of Eq. 14, includes a $t_{OX}$ factor due to the presence of silicon/silicon oxide interface charge $Q_f$ and (b) the two bulk charge terms which represent the voltage drop across the gate oxide. The two bulk charge terms are of opposite sign and tend to partially cancel each other in Eq. 40, while the contribution due to interface charge $Q_f$ is normally small.

The $V_{T0}$ dependence on gate oxide thickness $t_{OX}$ in Eq. 17 for metallurgical-channel operation arises from (a) the $V_{FB(C)}$ flat-band term which again includes gate oxide thickness $t_{OX}$ due to interface charge $Q_f$ and (b) the $(y_J - y_{JMIN})$ channel charge term which includes a $C_{OX}$ factor. The $t_{OX}$ factors in these two terms are of opposite sign. Also, the $Q_f$ term again is small. As the crossover boundary is approached from the metallurgical-channel operation side, the $(y_J - y_{JMIN})$ difference term becomes progressively smaller and reaches zero at the crossover boundary, the only remaining dependance on gate oxide thickness $t_{OX}$ being provided by the small $Q_f$ factor.

The substantial independence of threshold voltage $V_{T0}$ on gate oxide thickness $t_{OX}$ at the crossover boundary can be pictorially seen in FIG. 11b. For each different value of channel dopant concentration $N_C$, the three $V_{T0}$-$y_J$ curves representing different values of thickness $t_{OX}$ converge on a single value of threshold voltage $V_{T0}$ at the crossover boundary location where junction depth $y_J$ equals $y_{JMIN}$. The converging point for the three $V_{T0}$-$y_J$ curves representing different values of thickness $t_{OX}$ at each different value of channel dopant concentration $N_C$ is indicated by a dark circle in FIG. 11b.

Note that the dark crossover circles at the three different values of channel dopant concentration $N_C$ in FIG. 11b are all within approximately 10% of the same $V_{T0}$ value (-1 V) even though there is approximately an order of magnitude (factor of ten) variation in minimum junction depth $y_{JMIN}$ (0.02 $\mu$m to 0.2 $\mu$m) from the highest value of channel concentration $N_C$ to the lowest value of channel concentration $N_C$. This indicates that long-channel threshold voltage $V_{T0}$ is largely independent of junction depth $y_J$ and channel dopant concentration $N_C$ at the crossover boundary. For field-induced-channel operation slightly away from the crossover boundary, the low $V_{T0}$ sensitivity to channel concentration $N_C$ and junction depth $y_J$ continues, provided that channel dopant concentration $N_C$ is much less than background body dopant concentration $N_{BO}$.

Another advantage of field-induced-channel p-channel CJIGFET 60 is increased drive current and reduced short-channel effects compared to a surface-channel p-channel IGFET of approximately the same size. This occurs because there is less bulk charge in field-induced-channel CJIGFET 60 than in the surface-channel IGFET. Unlike a surface-channel IGFET, which starts conduction from a state in which the bulk charge is at a maximum, a CJIGFET such as field-induced CJIGFET 60 ideally turns on from a state of zero bulk charge. Also, the vertical electric field which would otherwise (a) stress the gate dielectric layer, (b) enhance undesirable hot-carrier injection, and (c) degrade surface mobility is zero at the threshold point in a CJIGFET and increases only from that point up to full conduction. This ensures increased device reliability and a more abrupt, and thus more desirable, turn-on.

Unfortunately, threshold voltage $V_{T0}$ of a conventional field-induced-channel CJIGFET, such as p-channel CJIGFET 60, is controlled strongly by the work function of the polysilicon gate electrode at a value whose minimum magnitude is in the vicinity of 1 V. Achieving a considerably lower $V_{T0}$ magnitude—e.g., 0.5 V or less—appears unfeasible with a polysilicon-gate field-induced-channel CJIGFET.

As FIGS. 11a and 11b indicate, threshold voltage $V_{T0}$ of a normally off polysilicon-gate metallurgical-channel CJIGFET, such as p-channel CJIGFET 20, can be set at a magnitude of 0.5 V or less. While this is theoretically possible, the resulting $V_{T0}$ magnitude typically exhibits large variations in value during CJIGFET fabrication due to inherent variations in gate oxide thickness $t_{OX}$ and channel doping $N_C$ as FIGS. 11a and 11b also indicate. It does not appear that complementary polysilicon-gate CJIGFETs can meet the low threshold-voltage requirements of complementary-IGFET applications where the supply voltages are so low that the magnitudes of the threshold voltages for both the n-channel and p-channel IGFETs need to be 0.5 V or less.

1.5 CJIGFETs with General Gate Electrodes

As discussed further below, the present invention overcomes the threshold-voltage limitations of complementary polysilicon-gate CJIGFETs by expanding the candidates for the gate electrodes of both the n-channel and p-channel CJIGFETs to include certain materials beside polysilicon. Although the CJIGFETs employed in the complementary-transistor structure of the invention are typically formed from a silicon semiconductor body, the material of a semiconductor body can be a monocrystalline material other than monosilicon. Likewise, the gate dielectric can be a material other than silicon oxide.

Much of the preceding analysis, while developed to analyze the operation of polysilicon-gate CJIGFETs, applies to the metallurgical-channel and field-induced-channel operation of the CJIGFETs employed in the complementary-CJIGFET structure of the invention, subject to the gate electrode material not being limited to polysilicon, the semiconductor body material not being limited to monosilicon, and the gate dielectric material not being limited to silicon oxide. Eqs. 3–13, 16–26, 28, 29, 31–40, 42, 43, and 47–57 all apply to the CJIGFETs utilized in the present complementary-transistor architecture with the understanding that terms such as intrinsic carrier concentration $n_i$, electron affinity $\chi_S$, band-gap energy $E_G$, permittivity $\in_S$, channel-surface work function $\Phi_{S(0)}$, channel-surface Fermi potential $\Phi_{F(0)}$, body Fermi potential $\Phi_{F(B)}$, channel Fermi potential $\Phi_{F(C)}$, conduction band energy $E_C$, and valence band energy $E_V$ are parameters for a general semiconductor material and with the understanding that terms such as capacitance $C_{OX}$ per unit area, thickness $t_{OX}$, inversion voltage drop $\Delta\psi_{OXINV}$, and permittivity $\in_{OX}$ are parameters for a general gate dielectric material. In fact, the gate dielectric material need not even be an oxide of a semiconductor material. Similarly, interface charge $Q_f$ generally means the charge at the interface between the semiconductor body and the gate dielectric layer.

For metallurgical-channel operation in the invention, Eq. 14 is replaced with:

$$V_{FB(C)} = \Phi_{M(G)} - \Phi_{S(C)} - \frac{Q_f}{C_{OX}} \tag{56}$$

where $\Phi_{M(G)}$ is the work function of a general gate electrode. Subject to thick-channel flat-band voltage $V_{FB(C)}$ being determined from Eq. 56 rather than Eq. 14, Eq. 17 still gives thick-channel ($y_J > y_{JMIN}$) threshold voltage $V_{TO}^m$ during metallurgical-channel operation of a p-channel CJIGFET having a general gate electrode.

For field-induced-channel operation in the invention, Eq. 27 for flat-band voltage $V_{FB}$ is replaced with:

$$V_{FB} = \Phi_{M(G)} - \Phi_{S(0)} - \frac{Q_f}{C_{OX}} \tag{57}$$

where $Q_f$ is now the gate dielectric-channel region interface charge per unit area. Areal capacitance $C_{OX}$ is now the capacitance per unit area of the gate dielectric regardless of whether it consists of an oxide of semiconductor material or not. Eq. 57 applies to both p-channel and n-channel CJIGFETs having general gate electrodes.

Thin-channel ($y_J < y_{JMIN}$) threshold voltage $V_{TO}^f$ during field-induced-channel operation of a CJIGFET having a general gate electrode is given by Eq. 38 subject to taking flat-band voltage $V_{FB}$ from Eq. 57 instead of Eq. 27. As so modified, Eq. 38 applies to both p-channel and n-channel CJIGETs having general gate electrodes.

Figure 13:
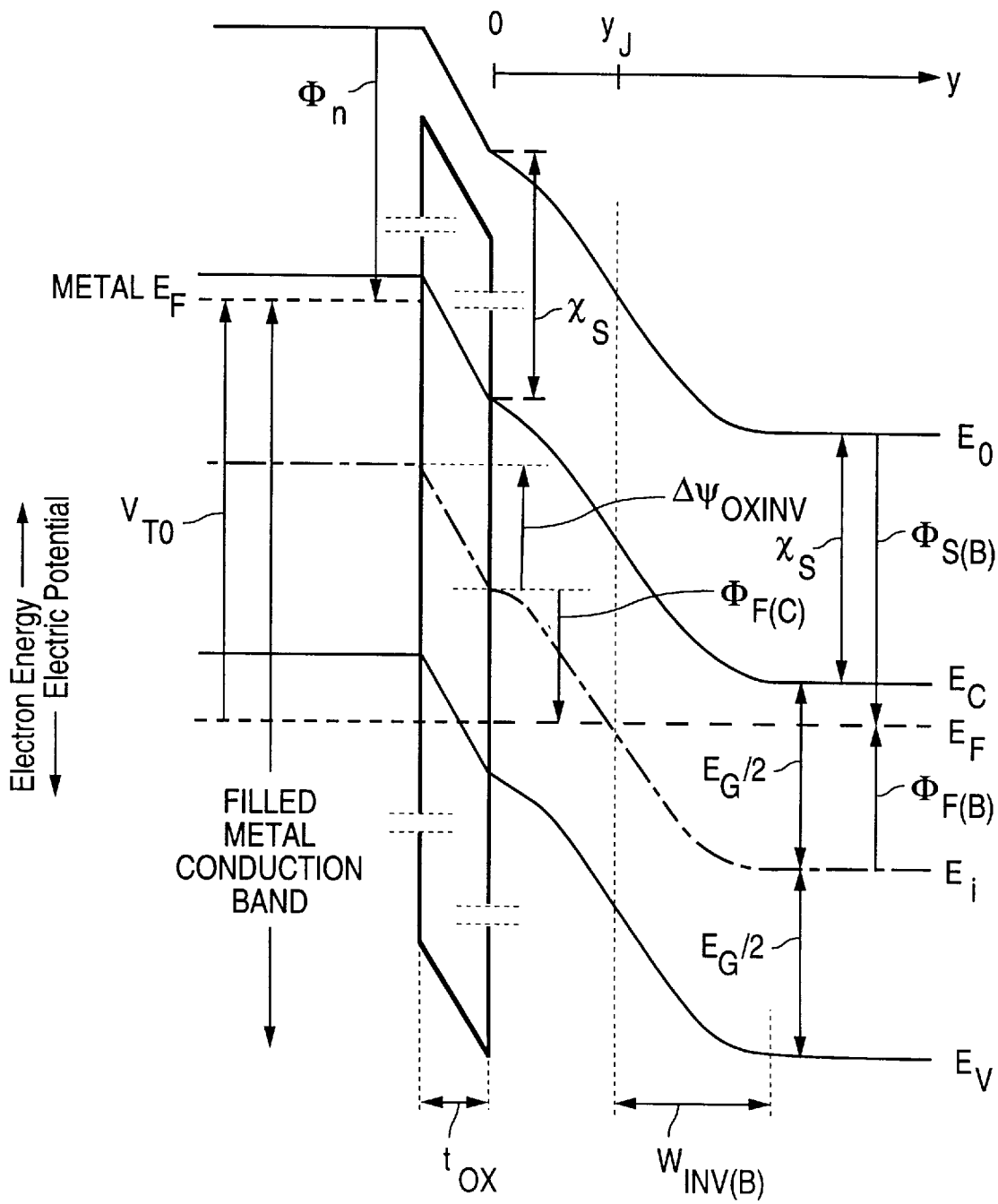
FIG. 13 is a simplified band diagram of the inversion condition for a CJIGFET having a general gate electrode and thus adaptable for use in the invention.

FIG. 13 illustrates the energy/potential bands at the threshold condition where surface inversion occurs for a p-channel CJIGFET having a general gate electrode. Thin-channel threshold voltage $V_{TO}^f$ for a p-channel CJIGFET having a general gate electrode can be determined directly from the band diagram of FIG. 13, without reference to flat-band voltage $V_{FB}$, as:

$$V_{TO}^f = \Phi_{F(B)} - \Phi_{F(C)} + \Delta\psi_{OXINV} + \Phi_{S(B)} - \frac{Q_f}{C_{OX}} \tag{58}$$

where Fermi potential $\Phi_{F(B)}$ in the electrically neutral bulk of the body region is given by Eq. 29, Fermi potential $\Phi_{F(C)}$ in the channel region of a thick-channel CJIGFET is given by Eq. 16, oxide voltage drop $\Delta\psi_{OXINV}$ at inversion is given by Eq. 42, and $\Phi_{S(B)}$ is the work function of the semiconductor material in the electrically neutral bulk of the body region.

From FIG. 13, bulk semiconductor work function $\Phi_{S(B)}$ is:

$$\Phi_{S(B)} = \chi_S + \frac{E_G}{2} + \Phi_{F(B)} \tag{59}$$

where $\chi_S$ is the electron affinity for the material of the semiconductor body, and $E_G$ is the valence-to-conduction band-gap energy for the material of the semiconductor body. Eq. 59 applies to both p-channel and n-channel CJIGFETs having general gate electrodes.

By using Eq. 59, bulk Fermi potential $\Phi_{F(B)}$ can be eliminated from Eq. 58 to produce the following $V_{TO}^f$ relationship during field-induced channel operation of a thin-channel CJIGFET having a general gate electrode:

$$V_{TO}^f = \Phi_{M(G)} - \Phi_{F(C)} - \frac{Q_f}{C_{OX}} - \chi_S - \frac{E_G}{2} + \Delta\psi_{OXINV} \tag{60}$$

As a check on Eq. 60, assume that the general gate electrode consists of polysilicon. In that case, general gate work function $\Phi_{M(G)}$ is determined as:

$$\Phi_{M(G)} = \chi_S + \frac{E_G}{2} + \Phi_{F(POLY)} \tag{61}$$

Substituting $\Phi_{M(G)}$ from Eq. 61 into Eq. 60 yields thin-channel threshold voltage $V_{TO}^f$ of Eq. 41.

At the crossover location between metallurgical-channel operation and field-induced channel operation where junction depth $y_J$ equals $y_{JMIN}$ oxide voltage drop $\Delta\psi_{OXINV}$ at inversion is zero. Use of Eq. 60 then yields the following crossover threshold voltage for a CJIGFET having a general gate electrode:

$$V_{TO} = V_{TO}^m = V_{TO}^f = V_{FB(C)} \tag{62}$$
$$= \Phi_{M(G)} - \Phi_{F(C)} - \left(\chi_S + \frac{E_G}{2}\right) - \frac{Q_f}{C_{OX}}$$

Note that general gate work function $\Phi_{M(G)}$ strongly controls crossover threshold voltage $V_{TO}$.

Eqs. 15 and 55, which define polysilicon-gate parameters, do not apply to the complementary-CJIGFET structure of the invention and need to be replaced with corresponding relationships applicable to general gate electrodes. For the case in which the semiconductor body consists of monosilicon, long-channel threshold voltage $V_{TO}$ for a CJIGFET having a general gate electrode is determined from $V_{T0}(10^{20})$ according to the following relationship that replaces Eq. 55:

$$V_{T0}=V_{T0}(10^{20})+\Phi_{M(G)}-\Phi_{M(POLY)}(10^{20}) \quad (63)$$

where $\Phi_{M(POLY)}(10^{20})$ is the work function of polysilicon at a net dopant concentration of $10^{20}$ atoms/cm$^3$. By using Eq. 63, the full-range design charts of FIGS. 11a and 11b can be threshold-shifted to provide values of threshold voltage $V_{T0}$ for a CJIGFET having a general gate electrode.

2. Design and Fabrication of Semiconductor Structure Containing Complementary CJIGFETs Whose Gate Electrodes Have Work Functions Close to Mid-Gap of Semiconductor Material 2.1 Crossover Characteristic of Low-Threshold CJIGFETs In the present invention, the gate electrodes of a pair of complementary CJIGFETs are formed with a material having a work function close to the mid-gap of the semiconductor material, normally silicon, that forms a semiconductor body in which the source/drain zones of the n-channel and p-channel CJIGFETs are located. By utilizing a mid-gap material for the gate electrodes of both types of CJIGFETs, the magnitudes of the threshold voltages for both the n-channel and p-channel CJIGFETs can be set close to each other at a value less than or equal to 0.5 V.

The parameter values for both CJIGFETs are chosen so as to place the transistors close to the crossover boundary between metallurgical-channel operation and field-induced-channel operation. By arranging for both of the complementary CJIGFETs to operate close to the crossover boundary, the present complementary-transistor structure approaches the highly ideal situation in which the electric field in the gate dielectric layer and at the interface between the gate dielectric layer and the semiconductor body (a) is zero at the threshold condition and (b) increases symmetrically, in magnitude, as the CJIGFETs are driven from the threshold condition into full conduction or into the off state. The surface electric field needed to meet the threshold inversion condition is created by the junction built-in electric field with no contribution from the gate-to-source voltage. The electric field produced by the gate-to-source voltage provides the additional field needed for conduction in strong inversion, beyond the threshold condition.

In the typical case, one of the transistors in the present complementary-CJIGFET structure is a field-induced-channel device. The field-induced-channel CJIGFET is a normally off transistor. In the typical case, the other transistor is a metallurgical-channel CJIGFET. Although values (relatively extreme) could be chosen for certain of the parameters of the metallurgical-channel CJIGFET so that it operates in a normally on mode, the metallurgical-channel device is usually a normally off CJIGFET.

As mentioned above, the work function of the gate electrode of a CJIGFET strongly controls its long-channel threshold voltage $V_{T0}$.

At the boundary between metallurgical-channel operation and field-induced-channel operation, the electric field in the gate dielectric is zero. Threshold voltage $V_{T0}$ at the crossover boundary for a CJIGFET having a general gate electrode is given by Eq. 62. The $Q_f/C_{OX}$ term provides a small contribution to flat-band voltage $V_{FB}$ and thus to threshold voltage $V_{T0}$ at the crossover boundary. Neglecting the $Q_f/C_{OX}$ term in Eq. 62 results in the following approximate expression for threshold voltage $V_{T0}$ of a CJIGFET at the crossover location:

$$V_{T0} = \Phi_{M(G)} - \left(\chi_S + \frac{E_G}{2}\right) - \Phi_{F(C)} \quad (64)$$

As with Eq. 62, Eq. 64 applies to both p-channel and n-channel CJIGFETs.

Examination of Eq. 64 indicates that substantially ideal operation is achieved when gate electrode work function $\Phi_{M(G)}$ is at the mid-point of band-gap energy $E_G$ of the semiconductor material—i.e.:

$$\Phi_{M(G)} = \chi_S + \frac{E_G}{2} \quad (65)$$

In this case, threshold voltage $V_{T0}$ at the crossover boundary between metallurgical-channel operation and field-induced-channel operation is approximately given as:

$$V_{T0}=\Phi_{F(C)} \quad (66)$$

Symmetrical control of the values of threshold voltage $V_{T0}$ for the p-channel and n-channel CJIGFETs is then achieved by appropriately controlling channel Fermi potential $\Phi_{F(C)}$.

Eq. 16 gives channel Fermi potential $\Phi_{F(C)}$ for a p-channel CJIGFET. For an n-channel CJIGFET, introducing a minus sign into Eq. 16 yields n-channel Fermi potential $\Phi_{F(C)}$. Consequently, threshold voltage $V_{T0}$ at the crossover boundary between metallurgical-channel operation and field-induced-channel operation for both p-channel and n-channel CJIGFETs can be expressed as:

$$V_{T0} = \pm\left(\frac{kT}{q}\right)\ln\left(\frac{N_C}{n_i}\right) \quad (67)$$

where the plus sign applies to an n-channel CJIGFET, and the minus sign applies to a p-channel CJIGFET.

In the analysis that led to the equations from which Eq. 67 was derived, the dopant profile in the vicinity of a channel-body pn junction was approximated by a step change in dopant concentration. For a real dopant profile in which the dopant concentration varies continuously in crossing the channel/body junction, uniform net channel dopant concentration $N_C$ in Eq. 67 is replaced with average net channel dopant concentration $\overline{N}_{CX}$ for the crossover condition.

Let $V_{TX}$ represent the magnitude (absolute value) of threshold $V_{T0}$ at the crossover condition between metallurgical-channel and field-induced-channel operation for a CJIGFET having a real dopant profile. Crossover threshold voltage magnitude $V_{TX}$ is then given approximately as:

$$V_{TX} = \left(\frac{kT}{q}\right)\ln\left(\frac{\overline{N}_{CX}}{n_i}\right) \quad (68)$$

At the crossover boundary, an ideal n-channel CJIGFET whose gate electrode consists of material having work function $\Phi_{M(G)}$ given by Eq. 65 has a positive threshold voltage of magnitude $V_{TX}$ given by Eq. 68, while an ideal p-channel CJIGFET whose gate electrode consists of material having work function $\Phi_{M(G)}$ given by Eq. 65 has a negative threshold voltage of magnitude $V_{TX}$ likewise given by Eq. 68.

Consider an example, analogous to the cases examined in FIG. 11a, where average crossover channel dopant concentration $\overline{N}_{CX}$ is $10^{17}$ atoms/cm$^3$. In accordance with Eq. 68, the magnitude of threshold voltage $V_{T0}$ for an ideal CJIGFET operating at the crossover boundary is approximately 0.41 V. Across an $\overline{N}_{CX}$ range that extends an order of magnitude from $3\times10^{16}$ atoms/cm$^3$ to $3\times10^{17}$ atoms/cm$^3$, Eq. 68 yields a $V_{T0}$ magnitude range of 0.38–0.44 V. Complementary CJIGFETs that operate in accordance with Eq. 68 thus can readily achieve $V_{T0}$ magnitudes less than 0.5 V.

Note that threshold voltage $V_{T0}$ has a relatively small dependence on average channel dopant concentration NC at the boundary between metallurgical-channel and field-induced-channel operation. This occurs because of the logarithmic nature of Eq. 68. In general, average channel dopant concentration $\overline{N}_C$ can differ from average crossover channel dopant concentration $\overline{N}_{CX}$ by up to 30% without departing severely from crossover operation. Such differences can, for example, occur due to process variations during CJIGFET fabrication.

Also, threshold voltage $V_{T0}$ has a small dependence on junction depth $y_{JMIN}$ at the crossover boundary. In the above analytical models where a step change in dopant concentration occurs at the channel/body junction, Eq. 9 gives junction depth $y_{JMIN}$. For a real dopant profile, uniform dopant concentrations $N_C$ and $N_B$ in Eq. 9 are replaced with average dopant concentrations $\overline{N}_C$ and $\overline{N}_B$ to produce:

$$y_{JMIN} = \overline{L}_{D(C)} \sqrt{\frac{2\ln(\overline{N}_B \overline{N}_{CX}/n_i^2)}{1 + \overline{N}_{CX}/\overline{N}_B}} \tag{69}$$

where $\overline{L}_{D(C)}$ is the average extrinsic Debye length at average crossover dopant concentration $\overline{N}_{CX}$. By appropriately modifying Eq. 11, average crossover extrinsic Debye length $\overline{L}_{D(C)}$ is:

$$\overline{L}_{D(C)} = \sqrt{\frac{kT\epsilon_S}{q^2 \overline{N}_{CX}}} \tag{70}$$

Figure 14:
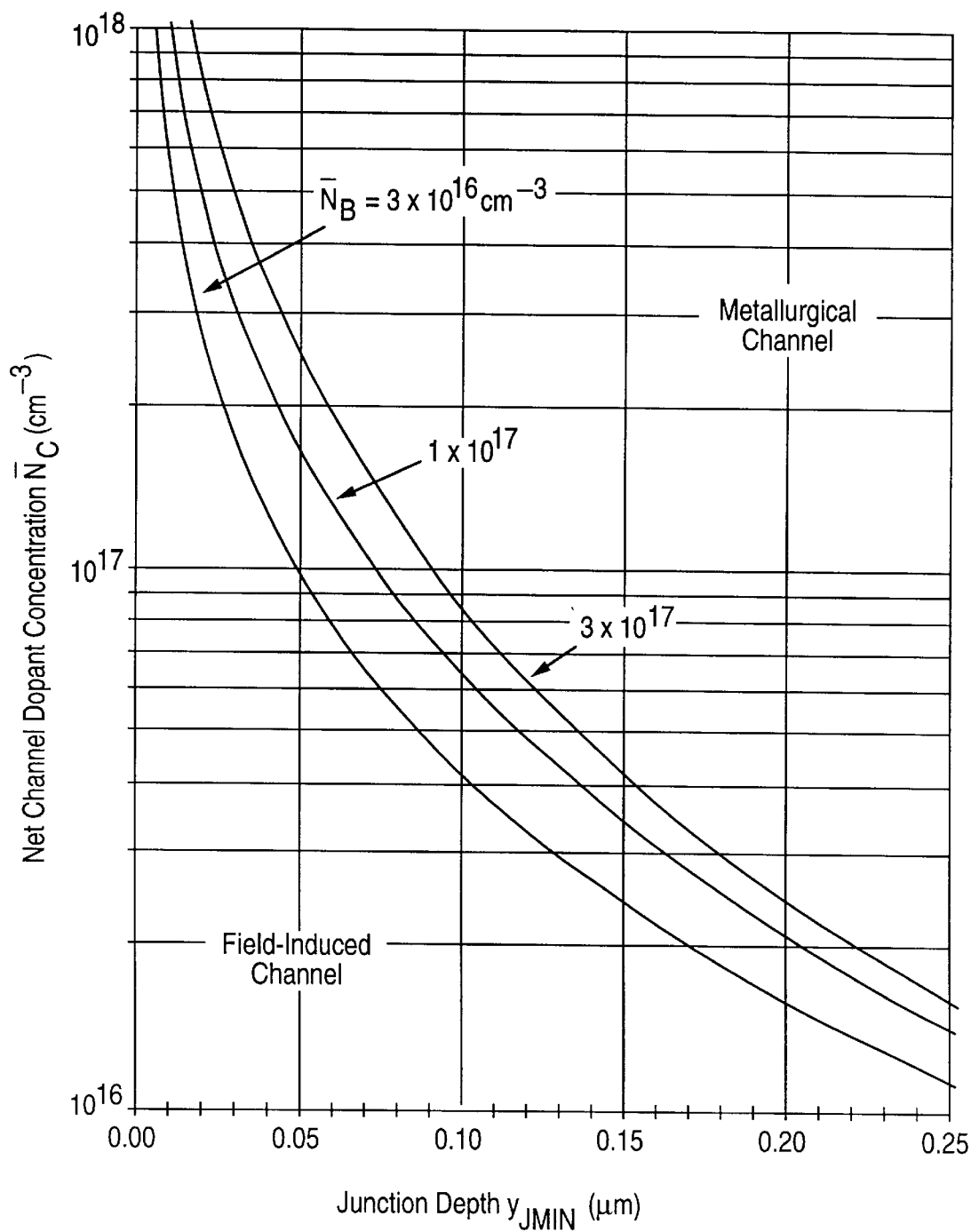
FIG. 14 is a design chart of average channel dopant concentration for a CJIGFET of the invention as the junction depth and average body dopant concentration are varied to satisfy the operational conditions at the crossover location between conduction by a buried-channel mechanism and conduction by a surface-channel mechanism.

Using Eqs. 69 and 70, FIG. 14 illustrates how average channel dopant concentration $\overline{N}_C$ varies as a function of junction depth $y_{JMIN}$ for three values of average body dopant concentration $\overline{N}_B$.

To achieve ideal threshold voltage $V_{TX}$ given by Eq. 68, the materials of the gate electrodes of both the n-channel and p-channel CJIGFETs in the complementary-transistor structure of the invention are chosen so as to set gate electrode work function $\Phi_{M(G)}$ for both gate electrodes at the mid-gap of the semiconductor material—i.e., at $\chi_S + E_G/2$ in accordance with to Eq. 65. Electron infinity $\chi_S$, a positive number, is the difference between vacuum energy level $E_0$ and lower energy $E_C$ at the edge of the conduction band of the semiconductor material. Conduction-to-valance band-gap energy $E_G$, also a positive number, is the difference between conduction band energy $E_G$ and even lower energy $E_V$ at the edge of the valance band of the semiconductor material.

For a complementary-CJIGFET structure created from a monosilicon semiconductor body, electron infinity $\chi_S$ is approximately 4.17 eV, while band-gap energy $E_G$ is approximately 1.08 eV. For monosilicon, energy $\chi_S+E_G/2$ at the mid-gap is approximately 4.71 eV. In accordance with Eq. 68, this is the ideal value of crossover gate electrode work function $\Phi_{MX}$ for the gate electrodes of both the n-channel and p-channel CJIGFETs in the present complementary-transistor structure.

2.2 Gate Electrode Materials for Complementary Low-Threshold CJIGFETs

Achieving gate electrode work function $\Phi_{M(G)}$ precisely at ideal value $\Phi_{MX}$ for both the n-channel and p-channel CJIGFETs in the present complementary-transistor structure is difficult. However, much of the advantages that accrue at the ideal $\Phi_{MX}$ value for both types of CJIGFETs are attained when gate electrode work function $\Phi_{M(G)}$ for both the n-channel and p-channel devices is close to $\Phi_{MX}$.

In particular, substantial advantages in terms of (for example) reduced gate electric field, reduced bulk charge, and substantial insensitivity of threshold voltage to parameters such as gate dielectric thickness are achieved when gate electrode work function $\Phi_{M(G)}$ of both the n-channel and p-channel CJIGFETs is within 0.30 eV of crossover work function $\Phi_{MX}$. This corresponds to a $\Phi_{M(G)}$ range of 4.41 eV to 5.01 eV for a complementary-CJIGFET structure created from a monosilicon semiconductor body. Refractory materials whose work functions fall within this range so as to be candidates for the gate electrodes of the CJIGFETs in the complementary-transistor architecture of the invention are:

a. Molybdenum with a work function of 4.60 eV,
    b. Tungsten with a work function of 4.55 eV, and
    c. Cobalt with a work function of 5.00 eV.

For a monosilicon semiconductor body, the closest matching to $\Phi_{MX}$ among the three refractory materials is provided by molybdenum, while tungsten provides the second closest matching.

Another material that falls within the $\Phi_{M(G)}$ range of 4.41–5.01 eV is a polycrystalline silicon-germanium alloy doped heavily p type. The work function of heavily p-doped polycrystalline silicon-germanium containing 60% germanium by weight is approximately 4.84 eV. Since the mid-gap of silicon is at 4.71 eV, a silicon-germanium alloy of this composition provides matching to ideal crossover value $\Phi_{MX}$ that is almost as good as molybdenum for the gate electrodes of n-channel and p-channel CJIGFETs created from a monosilicon semiconductor body.

The work function of polycrystalline silicon-germanium is controlled by adjusting the percentage of germanium in the alloy. The ability to control the work function of a polycrystalline silicon-germanium alloy appears to arise because band-gap energy $E_G$ for germanium is approximately 0.67 eV and thus is smaller than the 1.08-eV silicon band-gap energy. The smaller band-gap energy of germanium causes a polycrystalline silicon-germanium alloy to have a smaller band-gap energy band than (pure) silicon. Accordingly to a simplified model presented in King et al cited above, conduction-band energy $E_C$ for a polycrystalline silicon-germanium alloy is approximately at the same level as that of silicon, whereas valance band energy $E_V$ for the polycrystalline silicon-germanium alloy is pulled up to account for the reduced value of band-gap energy $E_G$.

When a polycrystalline silicon-germanium alloy is heavily doped p-type, Fermi energy $E_F$ is shifted in the same direction and by approximately the same amount as valance band energy $E_V$. The work function of heavily doped p-type polycrystalline silicon-germanium containing 60% germanium is lowered approximately 0.41 eV compared to silicon. This results in the above-mentioned work function of 4.84 eV for the heavily doped p-type 60%-germanium polycrystalline silicon-germanium alloy.

Use of heavily p-doped polycrystalline silicon-germanium for the gate electrodes of both the n-channel and p-channel CJIGFETs in the present complementary-transistor structure is advantageous in several respects. Polycrystalline silicon-germanium doped heavily p-type provides a stable oxide and has a high melting point, just like monosilicon or polysilicon. Heavily doped p-type polycrystalline silicon-germanium can be readily integrated into an overall complementary-CJIGFET process. Also, further adjustment of the germanium percentage in the alloy may bring the work function even closer to the ideal 4.71-eV value without sacrificing, or substantially sacrificing, the preceding advantages.

Note that the work function of heavily doped p-type polysilicon, conventionally used for the gate electrodes of IGFETs, is typically in the vicinity of 5.27 eV. This is well outside the desired 4.41-eV-to-5.01-eV range. Likewise, the work function of heavily doped n-type polysilicon is typically in the vicinity of 4.17 eV and is well outside the desired range.

Preferably, gate electrode work function $\Phi_{M(G)}$ of both the n-channel and the p-channel CJIGFETs in the present complementary-transistor structure is within 0.20 eV of ideal crossover value $\Phi_{MX}$. That is, gate electrode work function $\Phi_{M(G)}$ is preferably in the range of 4.51–4.91 eV for a structure created from a monosilicon semiconductor body. When gate electrode work function $\Phi_{M(G)}$ of both CJIGFETs is in this narrower range, the complementary-transistor structure of the invention comes closer to achieving the crossover advantages of zero gate electric field, zero bulk charge at threshold, and substantially full independence of threshold voltage $V_{T0}$ on parameters such as gate dielectric thickness. Materials that provide work functions in the 4.51-eV-to-4.91-eV range are molybdenum, tungsten, and heavily doped p-type polycrystalline silicon-germanium.

Even more preferably, gate electrode work function $\Phi_{M(G)}$ for both types of CJIGFETs in the present structure is within 0.15 eV of crossover value $\Phi_{MX}$. This corresponds to a range of 4.56–4.86 eV when the structure is created from a monosilicon semiconductor body. By narrowing the $\Phi_{M(G)}$ range further in this manner, the complementary-CJIGFET structure of the invention comes even closer to fully achieving the advantages of the ideal structure in which gate electrode work function $\Phi_{M(G)}$ equals $\Phi_{MX}$ for both the n-channel and p-channel devices. Materials whose work functions fall within the 4.56-eV-to-4.86-eV range are molybdenum and heavily p-doped polycrystalline silicon-germanium.

Let $\Delta\Phi_{MX}$ represent the difference $\Phi_{M(G)}-\Phi_{MX}$ between (a) the actual work function of the gate electrodes for each of the n-channel and p-channel CJIGFETs and (b) the ideal gate electrode work function at crossover. Work function difference $\Delta\Phi_{MX}$ is positive when $\Phi_{M(G)}$ is greater than $\Phi_{MX}$, and vice versa. To account for work function difference $\Delta\Phi_{MX}$, Eq. 67 is modified to produce:

$$V_{T0(n)} = \left(\frac{kT}{q}\right)\ln\left(\frac{\overline{N}_{C(n)}}{n_i}\right) + \Delta\Phi_{MX} \quad (71)$$

$$V_{T0(p)} = -\left(\frac{kT}{q}\right)\ln\left(\frac{\overline{N}_{C(p)}}{n_i}\right) + \Delta\Phi_{MX} \quad (72)$$

where $V_{T0(n)}$ is the n-channel threshold voltage, $\overline{N}_{C(n)}$ is the average net channel dopant concentration for an n-channel CJIGFET, $V_{T0(P)}$ is the p-channel threshold voltage, and $\overline{N}_{C(p)}$ is the average net channel dopant concentration for a p-channel CJIGFET.

In terms of threshold voltage magnitude, Eqs. 71 and 72 can be rewritten as:

$$|V_{T0(n)}| = \left(\frac{kT}{q}\right)\ln\left(\frac{\overline{N}_{C(n)}}{n_i}\right) + \Delta\Phi_{MX} \quad (73)$$

$$|V_{T0(p)}| = \left(\frac{kT}{q}\right)\ln\left(\frac{\overline{N}_{C(p)}}{n_i}\right) - \Delta\Phi_{MX} \quad (74)$$

As Eqs. 73 and 74 indicate, the threshold voltage imbalance due to work function difference $\Delta\Phi_{MX}$ is $2\Delta\Phi_{MX}$.

To partially cancel or, if work function difference $\Delta\Phi_{MX}$ is sufficiently small, fully cancel the $2\Delta\Phi_{MX}$ threshold voltage imbalance and move closer to equal $V_{T0}$ magnitudes for the n-channel and p-channel CJIGFETs, the design location is moved away from the crossover boundary. This is accomplished by causing average net dopant concentrations $\overline{N}_{C(n)}$ and $\overline{N}_{C(p)}$ to differ from the ideal $\overline{N}_{CX}$ values in a complementary manner. One of the CJIGFETs then operates in the metallurgical-channel regime, while the other CJIGFET operates in the field-induced-channel regime.

In particular, when actual gate-electrode work function $\Phi_{M(G)}$ exceeds ideal value $\Phi_{MX}$ so that work function difference $\Delta\Phi_{MX}$ is positive, n-channel threshold voltage magnitude $|V_{T0(n)}|$ exceeds p-channel threshold voltage magnitude $|V_{T0(p)}|$. Accordingly, average n-channel dopant concentration $\overline{N}_{C(n)}$ is decreased relative to the crossover $\overline{N}_{CX}$ value for the n-channel CJIGFET so as to reduce n-channel threshold voltage magnitude $|V_{T0(n)}|$ and bring it closer to $|V_{T0(p)}|$. Likewise, average p-channel dopant concentration $\overline{N}_{C(p)}$ is increased relative to the crossover $\overline{N}_{CX}$ value for the p-channel CJIGFET so as to increase p-channel threshold voltage magnitude $|V_{T0(p)}|$ and bring it closer to $|V_{T0(n)}|$. The n-channel CJIGFET thereby operates in the field-induced-channel regime with surface-channel conduction in accordance with Eq. 40. The p-channel CJIGFET operates in the metallurgical-channel regime with buried-channel conduction in accordance with Eq. 17.

On the other hand, when actual gate-electrode work function $\Phi_{M(G)}$ is less than ideal value $\Phi_{MX}$ so that work function difference $\Delta\Phi_{MX}$ is negative, p-channel threshold voltage magnitude $|V_{T0(p)}|$ exceeds n-channel threshold voltage magnitude $|V_{T0(n)}|$. Threshold voltage magnitudes $V_{T0(n)}$ and $V_{T0(p)}$ are then brought closer together by adjusting channel dopant concentrations $\overline{N}_{C(n)}$ and $\overline{N}_{C(p)}$ in the opposite way from that described above. Consequently, the p-channel CJIGFET operates in the field-induced-channel regime, whereas the n-channel CJIGFET operates in the metallurgical-channel regime. In each case, the CJIGFET with the decreased average net channel dopant concentration goes into the field-induced-channel mode and conducts through a surface channel, whereas the CJIGFET with the increased average net channel dopant concentration goes into the metallurgical-channel mode and conducts through a buried channel.

2.3 Configuration of Low-Threshold Complementary-CJIGFET Structure of Invention

Figure 15A:
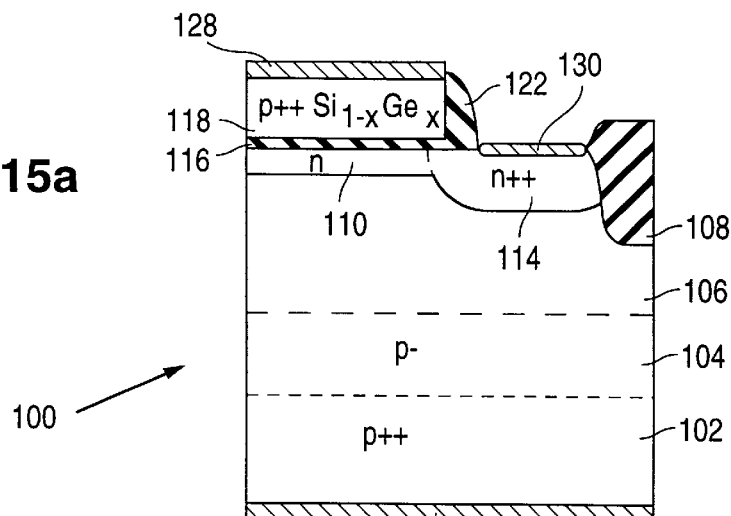
FIGS. 15a and 15b are cross-sectional structural views of the drain-side portions of p-channel CJIGFETs suitable for use in complementary-IGFET architecture according to the invention.
Figure 15B:
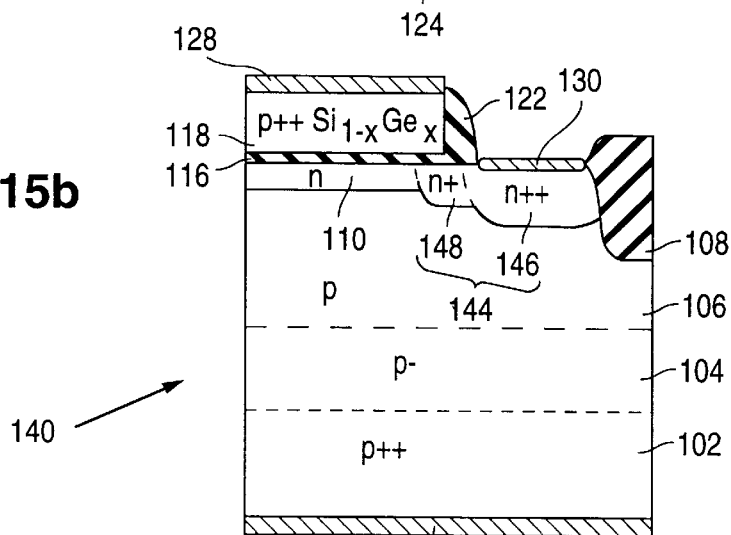

FIGS. 15a and 15b illustrate the drain sides of respective n-channel CJIGFETs 100 and 140 whose gate electrodes have work functions close to crossover value $\Phi_{MX}$ so that each of CJIGFETs 100 and 140 is suitable for use in the low-threshold complementary-transistor structure of the invention. Heavily p-doped polycrystalline silicon-germanium is utilized as the gate material in both of n-channel CJIGFETs 100 and 140. The difference between CJIGFETs 100 and 140 is in the drain configuration.

The starting point for n-channel CJIGFET 100 in FIG. 15a is a monosilicon semiconductor body consisting of a very heavily doped p-type substrate 102 and an overlying lightly doped p-type epitaxial layer 104. A moderately doped p-type well 106 is provided in p-epitaxial layer 104 along its upper surface to form a p body region for CJIGFET 100. An electrically insulating field-isolation region 108 of silicon oxide is partially sunk into epitaxial layer 104, specifically into an upper portion of p body region 106, along the upper semiconductor surface to define an active device region for CJIGFET 100. Field-oxide region 108 laterally separates the device region for CJIGFET 100 from other such active device regions provided in epitaxial layer 104.

CJIGFET 100 has a moderately doped n-type channel region 110 that forms a pn junction with p body region 106 in the semiconductor body. N channel region 110 extends between a very heavily doped n-type source zone (not shown) and a very heavily doped n-type drain zone 114 along the upper semiconductor service.

A gate dielectric layer 116 consisting of thermally grown silicon oxide lies on n channel region 110 along the upper semiconductor surface. A gate electrode 118 consisting of very heavily doped p-type polycrystalline silicon-germanium is situated on gate dielectric layer 116 above n-channel region 114 and extends slightly over n++ drain 118 and also slightly over the (unshown) n++ source. Gate-oxide layer 116 electrically insulates n channel region 110 from p++ polycrystalline $Si_{1-x}Ge_X$ gate electrode 118, where X is the fraction of germanium in the polycrystalline silicon-germanium alloy. An electrically insulating sidewall spacer 122 consisting of silicon oxide is situated along the drain side of p++ polycrystalline $Si_{1-x}Ge_X$ gate electrode 118. Another such silicon oxide sidewall spacer (unshown) is situated along the source side of gate electrode 118.

Electrical contact to p body region 106 is made through p++ substrate 102 and p– layer 104 by way of a metal contact 124 provided along the bottom of substrate 102. Metal silicide contacts 128 and 130 are provided along the upper surfaces of gate electrode 118 and drain 114 for making electrical contact to elements 118 and 114. Another such metal silicide contact (not shown) is provided along the upper surface of the source for electrically contacting the source. Sidewall spacer 122 separates drain contact 130 from gate electrode 118 and gate contact 128. The (unshown) sidewall spacer on the source side of gate electrode 118 performs the same function for the source in CJIGFET 100.

Turning to FIG. 15b, n-channel CJIGFET 140 consists of p++ substrate 102, p– epitaxial layer 104, p body region 106, field-oxide region 108, n channel region 110, gate dielectric layer 116, p++ polycrystalline $Si_{1-x}Ge_X$ gate electrode 118, drain-side sidewall spacer 122, a corresponding (unshown) source-side sidewall spacer, metal/substrate contact 124, metal silicide gate contact 128, metal silicide drain contact 130, and an (unshown) metal silicide source contact all arranged substantially the same as in CJIGFET 100.

In the drain configuration where CJIGFET 140 differs from CJIGFET 100, CJIGFET 140 has an n-type drain 144 arranged in a lightly doped drain ("LDD") structure. Drain 144 consists of a very heavily doped n-type main portion 146 and a more lightly doped n-type drain extension 148 extending between n channel region 110 and n++ main drain portion 146. Although n+ drain extension 148 is more lightly doped than n++ main drain portion 146, n+ drain extension 148 is more heavily doped than n channel region 110. Drain extension 148 extends slightly below p++ polycrystalline $Si_{1-x}Ge_X$ gate electrode 118. CJIGFET 140 has an n-type source (unshown) which is typically configured in the same way as drain 144. Alternatively, the source of CJIGFET 144 can be configured as a single, very heavily doped n-type zone in the same way that the (unshown) source of CJIGFET 100 is configured.

The reason for creating drain 144 of CJIGFET 140 in an LDD configuration is to reduce the electric field in the vicinity of drain 144 and thus reduce the number of hot carriers (electrons) injected into gate-oxide layer 116 near the drain end of CJIGFET 140 during device operation. However, the presence of n-channel region 110 itself tends to alleviate the hot-carrier problem. Accordingly, the drain architecture of CJIGFET 140 is optional depending on the channel doping and drain-voltage requirements.

Figure 16:
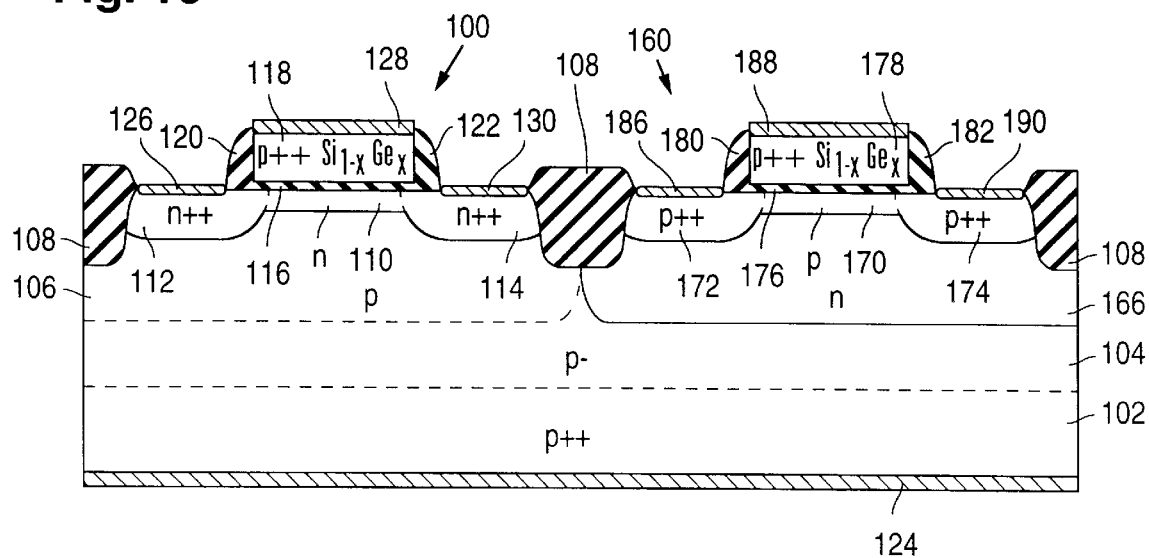
FIG. 16 is a cross-sectional structural view of a complementary-transistor structure containing a pair of n-channel and p-channel CJIGFETs in accordance with the invention.

A complete example of the complementary-CJIGFET architecture of the invention is shown in FIG. 16. In this example, the complementary-transistor structure is formed with n-channel CJIGFET 100 and a p-channel CJIGFET 160. N-channel CJIGFET 100 in FIG. 16 is configured the same as in FIG. 15a. In addition, FIG. 16 depicts a very heavily doped n-type source zone 112, an electrically insulating sidewall spacer 120 situated along the source side of p++ polycrystalline $Si_{1-x}Ge_X$ gate electrode 118, and a metal silicide source contact 126 for CJIGFET 100. Source 112 and drain 114 each extend considerably further below the upper semiconductor surface than channel region 110.

P-channel CJIGFET 160 is created from a moderately doped n-type well 166 provided in p–epitaxial layer 104 along the upper semiconductor surface. Well region 166 forms an n body region for CJIGFET 160. Field oxide 108 laterally surrounds an upper portion of n body region 166, thereby providing CJIGFET 160 with an active device region laterally separated from the active region for CJIGFET 140.

CJIGFET 160 contains a moderately doped p-type channel region 170 that forms a pn junction with n body region 166. P-channel region 170 extends between a very heavily doped p-type source zone 172 and a very heavily doped p-type drain zone 174 along the upper semiconductor surface. P++ source 172 and p++ drain 174 extend considerably further below the upper semiconductor surface than p channel region 170.

In CJIGFET 160, a gate dielectric layer 176 of silicon oxide electrically insulates p channel region 170 from an overlying gate electrode 178 formed with very heavily p-doped polycrystalline silicon-germanium. Electrically insulating side wall spacers 180 and 182 of silicon oxide are situated along the source and drain side of p++ polycrystalline $Si_{1-x}Ge_X$ gate electrode 178.

Electrical contact to p++ source 172, p++ polycrystalline $Si_{1-x}Ge_X$ gate electrode 178, and p++ drain 174 of CJIGFET 160 are achieved with metal silicide contacts 186, 188, and 190 provided respectively along the upper surfaces of elements 172, 178, and 174. Sidewall spacers 180 and 182 electrically insulate metal silicide source/drain contacts 186 and 190 from gate electrode 178 and metal silicide gate contact 188. Electrical contact to n body region 166 for CJIGFET 160 is typically provided along the upper semiconductor surface at a location not shown in FIG. 16.

Average body dopant concentration $\overline{N}_B$ and average channel dopant concentration $\overline{N}_C$ or $\overline{N}_{C(n)}$ at a specified value of junction depth $y_{JMIN}$ are determined for n-channel CJIGFET 100 in accordance with Eqs. 69 and 70. Similarly, average body dopant concentration $\overline{N}_B$ and average channel dopant concentration $\overline{N}_C$ or $\overline{N}_{C(p)}$ at a specified value of junction depth $y_{JMIN}$ are determined for p-channel CJIGFET 160 in accordance with Eqs. 69 and 70. The magnitudes of threshold voltages $V_{T0(n)}$ and $V_{T0(p)}$ for CJIGFETs 100 and 160 are thus approximately determined in accordance with Eqs. 73 and 74. Consequently, the $V_{T0(n)}$ and $V_{T0(p)}$ magnitudes are normally less than 0.5 V. Also, the $V_{T0(n)}$ and $V_{T0(p)}$ magnitudes are approximately equal to each other for CJIGFETs 100 and 160.

While heavily p-doped polycrystalline silicon-germanium has been used as the gate material in CJIGFETs 100 and 160, the gate material could alternatively consist of molybdenum, tungsten, or cobalt. Subject to a change in the value of work function difference $\Delta\Phi_{Mx}$, average dopant concentrations $\overline{N}_{C(n)}$, $\overline{N}_{C(p)}$, and $\overline{N}_B$ and the $V_{T0(n)}$ and $V_{T0(p)}$ magnitudes are approximately determined from Eqs. 69, 70, 73, and 74 in the same manner as for the particular embodiment of CJIGFETs 100 and 160 shown in FIG. 16.

2.4 Fabrication of Low-Threshold Complementary-CJIGFET Structure of Invention

The complementary-CJIGFET structure of FIG. 16 is fabricated in the following manner. Starting with p++ monosilicon substrate 102, p−monosilicon layer 104 is epitaxially grown along the upper surface of substrate 102. P body region 106 and n body region 166 are then formed in p−epitaxial layer 104. A dopant technique of the type described in Bulucea, U.S. patent application Ser. No. 08/420,927, filed Apr. 12, 1995, now abandoned, divisional filed Jun. 1, 1995 as U.S. patent application Ser. No. 08/456,454, now U.S. Pat. No. 5,744,372, is typically employed to form body regions 106 and 166. The dosages of the p-type and n-type dopants that respectively form p body region 106 and n body region 166 are chosen so as to achieve desired values of average body dopant concentration $\overline{N}_B$. A local-oxidation technique of the type described in Ser. No. 08/420,927 is then utilized to form field-oxide region 108. In forming field oxide 108, heavily doped p-type anti-inversion regions (not shown) are typically provided below field oxide 108 along the lateral periphery of p body region 106.

A photoresist mask is formed over the left-hand active region in FIG. 16, while the right-hand active region is left uncovered except for a thin overlying silicon oxide layer. An n-type dopant, typically arsenic, that serves to define n channel region 170 is ion implanted at a moderate dosage into the right-hand active region. The implant dose is chosen such that, after subsequent processing, channel region 170 achieves the value of average dopant concentration $\overline{N}_{C(n)}$ given approximately by Eqs. 69, 70, and 73. The photoresist is removed. An anneal may be performed to activate the implanted n-type channel dopant.

A photoresist mask is formed over the right-hand active region in FIG. 16, while leaving the left-hand active region uncovered except possibly for a thin overlying silicon oxide layer. A p-type dopant, typically boron, that serves to define p channel region 110 is ion implanted at a moderate dosage into the left-hand active region. The implant dose is chosen so that, after subsequent processing, channel region 110 achieves the value of dopant concentration $\overline{N}_{C(p)}$ approximately given by Eqs. 69, 70, and 74. The photoresist is removed. An anneal is performed to activate the implanted p-type channel dopant. This anneal also activates the n-type channel dopant if it is not already activated.

The thin oxide layers along the upper surfaces of the device active regions are removed. A thermal oxidation is performed to grow a thin layer of silicon oxide along the exposed portions of the upper semiconductor surface. Portions of this thin oxide layer later form gate dielectric layers 110 and 170.

A layer of very heavily doped p-type polycrystalline silicon-germanium is deposited on top of the structure. As in King et al cited above, the deposition an be performed with a hot-wall low-pressure chemical vapor deposition system using silane ($SiH_4$) and germane ($GeH_4$) as respective silicon and germanium sources gases at a deposition temperature of approximately 625° and a deposition pressure of 0.1–0.2 torr. For a silane flow rate of 25 standard $cm^3$/min., the germane flow rate is in the range of 5–15 standard $cm^3$/min. The percentage of germanium in the p++ polycrystalline silicon-germanium layer is typically in the vicinity of 60% by mass—i.e., fraction X is approximately 0.6.

Using a suitable photoresist mask, portions of the p++ polycrystalline silicon-germanium layer are removed to produce p++ $Si_{1-X}Ge_X$ gate electrodes 118 and 178. After removing the gate-electrode photoresist, a thermal oxidation is performed to seal gate electrodes 118 and 178.

A photoresist mask is formed over the right-hand active region in FIG. 16 while leaving the left-hand active region uncovered. Using field oxide 108 and gate electrode 118 as an implant shield, an n-type dopant, typically arsenic, that serves to define n++ source/drain zones 112 and 114 is ion implanted at a very heavy dosage into the portions of the left-hand active region not covered by the implant shield. Although the n-type source/drain dopant also enters p++ polycrystalline $Si_{1-X}Ge_X$ gate electrode 118 at a very heavy dosage, the very heavy dosage of the n-type source/drain dopant is much less than the very heavy dosage of p-type dopant already present in gate electrode 118. Hence, the very heavy dosage of the n-type source/drain implant does not counterdope gate electrode 118. The photoresist, is subsequently removed. An anneal may be performed to activate the implanted n-type source/drain dopant and drive it deeper into the semiconductor body.

A photoresist mask is formed over the left-hand active region in FIG. 16 while leaving the right-hand active region uncovered. Using field oxide 108 and gate electrode 178 as an implant shield, a p-type dopant, typically boron, that serves to define p++ source/drain zones 112 and 174, is ion implanted at a very heavy dosage into the portions of the right-hand active region not covered by the implant shield. Some of the source/drain dopant enters p++ polycrystalline $Si_{1-X}Ge_X$ gate electrode 178. Since gate electrode 178 is heavily doped p type, the introduction of further p-type dopant into electrode 178 does not significantly affect its electrical characteristics. The photoresist is removed.

An anneal is performed to activate the implanted p-type source/drain dopant and drive it deeper into the semiconductor body. This anneal also activates the n-type source/drain dopant if it is not already activated.

Source/drain zones 112, 114, 172, and 174 are largely complete at this point. The portion of the n-type channel dopant introduced into the left-hand active device region outside n++ source/drain zones 112 and 114 forms n channel region 110. Similarly, the portion of the p-type channel dopant introduced into the right-hand active device region outside p++ source/drain zones 172 and 174 forms p channel region 170.

A layer of low-temperature silicon oxide is conformally deposited on top of the structure. An anisotropic etch is performed to remove all of the conformal oxide except for sidewall spacers 120, 122, 180, and 182. Metal silicide contacts 126, 128, 130, 186, 188, and 190 are then formed. The structure is completed by forming metal contact 124 along the bottom of substrate 102.

For embodiments in which the gate material is molybdenum, tungsten, or cobalt, the foregoing process is modified by replacing the heavily p-doped silicon-germanium layer with a molybdenum, tungsten, or cobalt layer. The molybdenum, tungsten, or cobalt layer is then patterned in the same manner as the p-doped polycrystalline silicon-germanium layer. Introduction of n-type dopant or p-type dopant into the molybdenum, tungsten, or cobalt layer does not affect its electrical characteristics. Accordingly, exposing the gate electrodes of the complementary CJIGFETs to n-type and/or p-type dopant does not impact the CJIGFET operation.

2.5 Variations

While the invention has been described with reference to particular embodiments, this description is solely for the purpose of illustration and is not to be construed as limiting the scope of the invention claimed below. For example, materials having work functions close to the mid-gap energy of the semiconductor material, typically silicon, can be used as the gate material in place of heavily p-doped polycrystalline silicon-germanium, molybdenum, tungsten can, and cobalt. An alloy of cobalt and either molybdenum or tungsten be utilized to achieve a work function very close to the mid-gap of silicon.

The complementary CJIGFETs of the invention can be created in LDD configurations by performing appropriately masked LDD n-type and p-type ion implantations directly after the gate-electrode seal oxidation, forming sidewall spacers for the gate electrodes by a low-temperature silicon-oxide conformal deposition/anisotropic etch procedure, and then performing appropriately masked n-type and p-type ion implantations at very heavy dosages. Epitaxial layer 104 can be replaced with lightly doped p-type bulk silicon. Also, by performing a high-energy p-type ion implantation at a very heavy dosage, a very heavily doped buried p-type layer equivalent to p++ substrate 102 can be formed.

Trench isolation can be substituted for field oxide 108 formed by local oxidation. Various modifications and applications may thus be made by those skilled in the art without departing from the true scope and spirit of the invention as defined in the appended claims.

We claim:

1. A complementary-transistor structure comprising:
   a body of semiconductor material having an upper semiconductor surface, the semiconductor material characterized by an electron affinity $\chi_S$ and a valence-to-conduction band-gap energy $E_G$; and
   complementary first and second field-effect transistors, each comprising:
      a pair of laterally separated source/drain zones situated in the semiconductor body along the upper semiconductor surface;
      a channel region extending between the source/drain zones in the semiconductor body along the upper semiconductor surface; and
      a gate electrode overlying the channel region, electrically insulated from the channel region, and having a work function within 0.3 eV of $\chi_S+E_G/2$; where the source/drain zones and channel region of the first transistor are of a first conductivity type, and the source/drain zones and channel region of the second transistor are of a second conductivity type opposite to the first conductivity type.

2. A structure as in claim 1 wherein:
   one of the transistors conducts current according to a field-induced-channel mode; and
   the other transistor conducts current according to a metallurgical-channel mode.

3. A structure as in claim 1 wherein the gate electrodes of both transistors consist of electrically conductive material of largely the same type.

4. A structure as in claim 3 wherein:
   the work functions of the gate electrodes are largely equal;
   the first and second conductivity types respectively are n-type and p-type whereby the first and second transistors respectively are n-channel and p-channel transistors; and
   the first and second transistors are respectively operable in field-induced-channel and metallurgical-channel modes when the work functions are greater than $\chi_S+E_G/2$, and vice versa when the work functions are less than $\chi_S+E_G/2$.

5. A structure as in claim 1 wherein the work function of the gate electrode of each transistor is within 0.2 eV of $\chi_S+E_G/2$.

6. A structure as in claim 1 wherein the work function of the gate electrode of each transistor is within 0.15 eV of $\chi_S+E_G/2$.

7. A structure as in claim 1 wherein each transistor is a normally off device.

8. A structure as in claim 1 where each transistor has a threshold voltage whose magnitude is no more than 0.5 V.

9. A structure as in claim 1 wherein each transistor has a threshold voltage whose magnitude is within 0.3 V of value $V_{TX}$ determined from:

$$V_{TX} = \left(\frac{kT}{q}\right)\ln\left(\frac{\overline{N}_{CX}}{n_i}\right)$$

where k is Boltzmann's constant, T is the absolute temperature, q is the electronic charge, $\overline{N}_{CX}$ is the average net dopant concentration of the channel region for that transistor at the surface-channel-to-buried-channel crossover location, and $n_i$ is the intrinsic carrier concentration of the semiconductor material, the threshold voltage of one of the transistors being positive, the threshold voltage of the other transistor being negative.

10. A structure as in claim 1 wherein the source/drain zones of each transistor extend deeper below the upper semiconductor surface than the channel region of that transistor.

11. A structure as in claim 1 wherein the semiconductor body further includes, for each transistor, a body region that adjoins, and is of opposite conductivity type to, the channel region of that transistor, the body region and channel region of each transistor thereby forming a pn junction.

12. A structure as in claim 11 wherein the channel region of each transistor is substantially depleted of charge when the gate electrode, body region, and one of the source/drain zones of that transistor are at substantially the same voltage.

13. A structure as in claim 11 wherein the channel region of each transistor has an average net dopant concentration that differs from value $\overline{N}_{CX}$ determined from:

$$y_{JMIN} = \overline{L}_{D(C)}\sqrt{\frac{2\ln(\overline{N}_B\overline{N}_{CX}/n_i^2)}{1+\overline{N}_{CX}/\overline{N}_B}}$$

where $y_{JMIN}$ is the depth below the upper semiconductor surface of that channel region at the surface-channel-to-buried-channel-crossover location, $\overline{N}_{CX}$ is the average net dopant concentration of that channel region at the surface-channel-to-buried-channel crossover location, $\overline{N}_B$ is the average net dopant concentration of the body region for that transistor, $n_i$ is the intrinsic carrier concentration of the semiconductor material, and $\overline{L}_{D(C)}$ is the average extrinsic Debye length given from:

$$\overline{L}_{D(C)} = \sqrt{\frac{kT\epsilon_s}{q^2\overline{N}_{CX}}}$$

where k is Boltzmann's constant, T is the absolute temperature, q is the electronic charge, and $\epsilon_S$ is the permittivity of the semiconductor material, the average net dopant concentration in the channel region of one of the transistors being greater than $\overline{N}_{CX}$ for that one transistor, the average net dopant concentration in the channel region of the other of the transistors being less than $\overline{N}_{CX}$ for that other transistor.

14. A structure as in claim 13 wherein charge carriers that move between the source/drain zones of each transistor when it is turned on flow through that transistor's channel region (a) along a buried channel situated below the upper semiconductor surface when the average net dopant concentration in that transistor's channel region is greater than $\overline{N}_{CX}$ and (b) along a surface channel situated along the upper semiconductor surface when the average net dopant concentration in that transistor's channel region is less than $\overline{N}_{CX}$.

15. A structure as in claim 14 wherein (a) the buried channel consists of largely undepleted semiconductor material and (b) the surface channel is created largely by field-induced inversion.

16. A structure as in claim 13 wherein:
a specified one of the transistors conducts current according to a field-induced-channel mode, the average net dopant concentration in the specified transistor's channel region being less than $\overline{N}_{CX}$ for the specified transistor; and
the remaining one of the transistors conducts current according to a metallurgical-channel mode, the average net dopant concentration in the remaining transistor's channel region being greater than $\overline{N}_{CX}$ for the remaining transistor.

17. A structure as in claim 16 wherein:
the work functions of the gate electrodes are largely equal;
the specified transistor is an n-channel transistor when the work functions are greater than $\chi_S+E_G/2$; and
the specified transistor is a p-channel transistor when the work functions are less than $\chi_S+E_G/2$.

18. A structure as in claim 1 wherein the semiconductor material consists primarily of silicon, and each gate electrode consists primarily of at least one of molybdenum, tungsten, and cobalt.

19. A structure as in claim 1 wherein the semiconductor material consists primarily of silicon, and each gate electrode consists primarily of conductively doped polycrystalline silicon-germanium.

20. A structure as in claim 19 wherein the polycrystalline silicon-germanium is p doped.

21. A method of fabricating a complementary-transistor structure from a body of semiconductor material having an upper semiconductor surface, the semiconductor body comprising a p-type body region and an n-type body region that extend to the upper semiconductor surface, the semiconductor material characterized by an electron affinity $\chi_S$ and a valence-to-conduction bandgap energy $E_G$, the method comprising the steps of:
introducing first n-type and p-type dopants respectively into the p-type and n-type body regions to respectively define an n-type channel region and a p-type channel region that extend to the upper semiconductor surface;
providing a first gate dielectric layer and a second gate dielectric layer respectively over the n-type and p-type channel regions;
forming a first gate electrode and a second gate electrode respectively over the first and second gate dielectric layers respectively above the n-type and p-type channel regions such that each gate electrode has a work function within 0.3 eV of $\chi_S+E_G/2$;
selectively introducing second n-type and p-type dopants respectively into the p-type and n-type body regions to respectively form (a) a pair of laterally separated n-type source/drain zones which extend to the upper semiconductor surface and between which the n-type channel region extends and (b) a pair of laterally separated p-type source/drain zones which extend to the upper semiconductor surface and between which the p-type channel region extends, an n-channel field-effect transistor comprising the n-type source/drain zones, the n-type channel region, the first gate dielectric layer, and the first gate electrode, a p-channel field-effect transistor comprising the p-type source/drain zones, the p-type channel region, the second gate dielectric layer, and the second gate electrode.

22. A method as in claim 21 wherein the forming step entails forming both gate electrodes from largely the same electrically conductive material.

23. A method as in claim 22 wherein the first dopants are introduced into the body regions under such doping conditions that each transistor attains a threshold voltage whose magnitude is within 0.3 V of value $V_{TX}$ determined from:

$$V_{TX} = \left(\frac{kT}{q}\right)\ln\left(\frac{\overline{N}_{CX}}{n_i}\right)$$

where k is Boltzmann's constant, T is the absolute temperature, q is the electronic charge, $\overline{N}_{CX}$ is the average net dopant concentration of the channel region for that transistor at the surface-channel-to-buried-channel crossover location, and $n_i$ is the intrinsic carrier concentration of the semiconductor material, the threshold voltage of one of the transistors being positive, the threshold voltage of the other transistor being negative.

24. A method as in claim 22 wherein the channel region of each transistor has an average net dopant concentration differs from value $\overline{N}_{CX}$ determined from:

$$y_{JMIN} = \overline{L}_{D(C)}\sqrt{\frac{2\ln(\overline{N}_B\overline{N}_{CX}/n_i^2)}{1+\overline{N}_{CX}/\overline{N}_B}}$$

where $y_{JMIN}$ is the depth below the upper semiconductor surface of that channel region at the surface-channel-to-buried-channel-crossover location, $\overline{N}_{CX}$ is the average net dopant concentration of that channel region at the surface-channel-to-buried-channel crossover location, $\overline{L}_{D(C)}$ is the average extrinsic Debye length at dopant concentration $\overline{N}_{CX}$, $\overline{N}_B$ is the average net dopant concentration of the body region for that transistor, and $n_i$ is the intrinsic carrier concentration of the semiconductor material, the average net dopant concentration in the channel region of one of the transistors being greater than $\overline{N}_{CX}$ for that one transistor, the average net dopant concentration in the channel region of the other of the transistors being less than $\overline{N}_{CX}$ for that other transistor.

25. A method as in claim 22 wherein the forming step entails forming the gate electrodes primarily from at least one of molybdenum, tungsten, cobalt, and conductively doped polycrystalline silicon-germanium.

* * * * *